United States Patent
Kitagawa et al.

(10) Patent No.: US 10,175,576 B2
(45) Date of Patent: Jan. 8, 2019

(54) CURABLE COMPOSITION FOR PHOTO IMPRINTS, METHOD FOR FORMING PATTERN, FINE PATTERN, AND METHOD FOR MANUFACTURING SEMICONDUCTOR DEVICE

(71) Applicant: FUJIFILM Corporation, Tokyo (JP)

(72) Inventors: Hirotaka Kitagawa, Haibara-gun (JP); Yuichiro Goto, Haibara-gun (JP); Yuichiro Enomoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 726 days.

(21) Appl. No.: 14/643,512

(22) Filed: Mar. 10, 2015

(65) Prior Publication Data
US 2015/0185606 A1 Jul. 2, 2015

Related U.S. Application Data

(63) Continuation of application No. PCT/JP2013/075832, filed on Sep. 25, 2013.

(30) Foreign Application Priority Data

Sep. 27, 2012 (JP) .................. 2012-214775
Sep. 9, 2013 (JP) .................. 2013-185847

(51) Int. Cl.
| | |
|---|---|
| G03F 7/00 | (2006.01) |
| G03F 7/031 | (2006.01) |
| C08F 2/44 | (2006.01) |
| C08F 2/48 | (2006.01) |
| G03F 7/004 | (2006.01) |
| G03F 7/027 | (2006.01) |
| G03F 7/038 | (2006.01) |
| C09D 11/101 | (2014.01) |
| C09D 11/30 | (2014.01) |
| H01L 21/308 | (2006.01) |

(52) U.S. Cl.
CPC ............ *G03F 7/031* (2013.01); *C08F 2/44* (2013.01); *C08F 2/48* (2013.01); *C09D 11/101* (2013.01); *C09D 11/30* (2013.01); *G03F 7/0002* (2013.01); *G03F 7/0035* (2013.01); *G03F 7/0046* (2013.01); *G03F 7/027* (2013.01); *G03F 7/0388* (2013.01); *H01L 21/3088* (2013.01); *H01L 21/3081* (2013.01); *H01L 21/3086* (2013.01); *Y10T 428/24355* (2015.01)

(58) Field of Classification Search
CPC .... G03F 7/0002; G03F 7/0046; G03F 7/0048; G03F 7/027; G03F 7/031; Y10T 428/24802; B32B 3/10
See application file for complete search history.

(56) References Cited

U.S. PATENT DOCUMENTS

| | | | |
|---|---|---|---|
| 8,859,071 B2 | 10/2014 | Kodama | |
| 2011/0059302 A1 | 3/2011 | Kodama | |
| 2013/0071789 A1* | 3/2013 | Iwashita et al. | |

FOREIGN PATENT DOCUMENTS

| | | | | |
|---|---|---|---|---|
| JP | 2008-502157 A | | 1/2008 | |
| JP | 2010-239121 A | | 10/2010 | |
| JP | WO 2012111741 A1 * | | 8/2012 | ........... C07C 233/49 |
| WO | 2005/000552 A2 | | 1/2005 | |
| WO | 2005/120834 A2 | | 12/2005 | |
| WO | WO2010104188 A1 * | | 9/2010 | |

OTHER PUBLICATIONS

M. Bender et al., "Multiple imprinting in UV-based nanoimprint lithography: related material issues", Microelectronic Engineering, 2002, pp. 407-413, vols. 61-62.
M. Colburn et al., "Step and Flash Imprint Lithography: A New Approach to High-Resolution Patterning", Part of the SPIE Conference on Emerging Lithographic Technologies III, Mar. 1999, pp. 379-389, vol. 6376.
Stephen Y. Chou et al., "Imprint of sub-25 nm vias and trenches in polymers", Appl. Phys. Lett., Nov. 20, 1995, pp. 3114-3116, vol. 67, No. 21.
International Search Report for PCT/JP2013/075832 dated Oct. 22, 2013.
International Search Report for PCT/JP2013/071472 dated Sep. 17, 2013.
Written Opinion for PCT/JP2013/075832 dated Oct. 22, 2013.
Written Opinion for PCT/JP2013/071472 dated Sep. 17, 2013.
International Preliminary Report on Patentability dated Apr. 9, 2015 from the International Searching Authority in counterpart International Application No. PCT/JP2013/075832.

* cited by examiner

*Primary Examiner* — Gerard Higgins
(74) *Attorney, Agent, or Firm* — Sughrue Mion, PLLC

(57) ABSTRACT

Provided is a curable composition for photo imprints excellent in the mold releasability and the ink jettability. The curable composition for photo imprints, comprising: a polymerizable compound (A); a photo-polymerization initiator (B); and a mold releasing agent (C), the mold releasing agent (C) being represented by the formula (I) below. Rf represents a $C_{1-8}$ fluorine-containing alkyl group having two or more fluorine atoms; m represents 1 or 2; L represents a single bond or divalent linking group; n represents 1 or 2; X represents a single bond, oxygen atom, sulfur atom, or nitrogen atom; $R^1$ represents a $C_{1-8}$ substituent being free from a polymerizable group; $R^2$ represents a hydrogen atom, $C_{1-8}$ substituent, or divalent linking group; p represents 1 or 2, q represents 0 or 1, and r represents 1 or 2; $R^1$ and $R^2$ may combine with each other to form a ring.

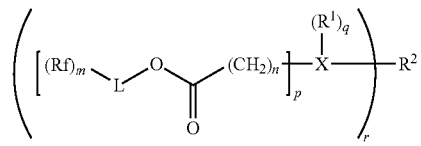

25 Claims, No Drawings

CURABLE COMPOSITION FOR PHOTO IMPRINTS, METHOD FOR FORMING PATTERN, FINE PATTERN, AND METHOD FOR MANUFACTURING SEMICONDUCTOR DEVICE

CROSS-REFERENCE TO RELATED APPLICATIONS

This application is a Continuation of PCT International Application No. PCT/JP2013/075832 filed on Sep. 25, 2013, which claims priority under 35 U.S.C § 119 (a) to Japanese Patent Application No. 2012-214775 filed on Sep. 27, 2012 and Japanese Patent Application No. 2013-185847 filed on Sep. 9, 2013. Each of the above application (s) is hereby expressly incorporated by reference, in its entirety, into the present application.

TECHNICAL FIELD

The present invention relates to a curable composition for photo imprints. In more detail, the present invention relates to a curable composition for photo imprints for forming, with the aid of irradiation of light, a fine pattern used for manufacturing semiconductor integrated circuit; flat screen; micro-electromechanical system (MEMS); sensor element; optical disk; magnetic recording medium such as high-density memory disk; optical components such as grating and relief hologram; nanodevice; optical device; optical film and polarization element for manufacturing flat panel display; thin-film transistor used for liquid crystal display device, organic transistor, color filter, over-coat layer, pillar, rib member for aligning liquid crystal, and microlens array; immunoassay chip; DNA separation chip; micro-reactor; nano-biodevice; optical waveguide; optical filter; and photonic liquid crystal.

BACKGROUND ART

Imprinting is a technique evolved from embossing well known in the field of manufacture of optical disk, which can precisely transfer fine patterns, by pressing a master mold having an irregularity pattern formed thereon (generally referred to as mold, stamper or template) against a resist material to thereby mechanically deform it. In recent years, the imprinting has been expected to be applied to various fields, since a mold, manufactured only once, will be used repetitively and economically for forming fine structures such as nano-structure.

Proposed imprinting processes include thermal imprinting using thermoplastic resin as a material to be processed (see Non-Patent Literature 1, for example), and photo imprinting using curable composition (see Non-Patent Literature 2, for example). In the thermal imprinting, a mold is pressed against a polymer resin heated at or above the glass transition temperature, cooled down to or below the glass transition temperature, and then released to thereby transfer the fine structure onto the resin. The method is very simple and is applicable to a variety of resin materials and glass materials.

On the other hand, in the photo-imprinting, a curable composition is irradiated with light through a translucent mold or light-transmissive substrate for photo-curing, and the mold is then released to transfer the fine pattern onto the photo-cured article. The method enables imprinting at room temperature, and is applicable to the field of high-precision processing such as manufacture of semiconductor integrated circuit. Recent reports have described new developments of nano-casting based on combination of advantages of both processes, and reversal imprinting capable of creating a three-dimensional stacked structure.

Applications below have been proposed for these imprinting processes.

A first application relates to the case where the molded pattern per se has a function, and is usable as an essential component or structural member in nano-technology. Examples include various micro- or nano-optical components, high-density recording media, optical film, and structural members in flat panel display device.

A second application relates to construction of a stacked structure by monolithic molding of micro-structure and nano-structure, or by simple inter-layer alignment, and use of such structure for manufacture of μ-TAS (Micro-Total Analysis System) or biochip.

A third application relates to use of the molded pattern as a mask for processing a substrate typically by etching. With the aid of high-precision alignment and high level of integration, this technique is applicable to manufacture of high-density semiconductor integrated circuit, manufacture of transistor for liquid crystal display device, and processing of magnetic material for next-generation hard disk called patterned medium, replacing the conventional lithographic technique. Efforts for practicing the imprinting, in relation to such applications, have been gathering momentum in these years.

From the beginning, the imprinting has suffered from mold releasability since it involves a process of releasing a mold. As a method of improving the mold releasability, there has been known a method of treating the surface of the mold using a mold releasing agent such as silane coupling agent having a perfluoro group. While the method, capable of reducing the surface energy of mold, is highly effective in terms of improving the mold releasability, the durability has remained insufficient due to degradation of the mold releasing agent as the imprinting is repeated.

As an effort of improving the durability of the mold releasing treatment, there has been known a method of incorporating a silane coupling agent having a perfluoro group into a curable composition (Non-Patent Literature 3). This method has suffered from poor shelf stability due to reactivity of the silane coupling agent, and this has resulted in increased defect of imprinted pattern.

As an effort of improving the mold releasability, there have been known a method of incorporating a surfactant having a perfluoro group into the curable composition (Patent Literature 1), and a method of incorporating a polymerizable compound having an alkyl group which contains two or more fluorine atoms into the curable composition (Patent Literature 2). These methods are successful in terms of ensuring a good shelf stability of the curable composition, which has been degraded by the silane coupling agent.

In recent years, ink jet process has attracted a lot of attention particularly in applications in need of precisely forming ultra-fine patterns (for example, etching resist for processing semiconductor substrate) (Patent Literature 3). The ink jet process, capable of controlling the amount of the curable composition depending on sparseness and denseness of pattern, can successfully reduce variation in the thickness of residual film. The process also takes an advantage over spin coating, in terms of efficiency of utilization of material. Meanwhile, the process has suffered from incomplete filling of the curable composition or non-uniform thickness of the residual film, if ink jetting is inaccurate and unstable.

CITATION LIST

Patent Literature

[Patent Literature 1] International Patent WO2005/000552, Pamphlet
[Patent Literature 2] JP-A-2010-239121
[Patent Literature 3] Japanese Translation of PCT International Application Publication JP-T2-2008-502157

Non-Patent Literature

[Non-Patent Literature 1] S. Chou et al., *Appl. Phys. Lett.*, 67, 3114 (1995)
[Non-Patent Literature 2] M. Colbun et al., *Proc. SPIE*, 3676, 379 (1999)
[Non-Patent Literature 3] M. Bender et al., *Microelectronic Engineering*, 61-62, 407 (2002)

SUMMARY OF THE INVENTION

Technical Problem

The present inventors found from our intensive studies on the prior art, that the method of incorporating a surfactant having a perfluoro group into the curable composition, and the method of incorporating a polymerizable compound having an alkyl group which contains two or more fluorine atoms into the curable composition considerably lowered the surface tension of the curable composition. Such curable compositions degrade, in particular, the ink jettability.

It is therefore a subject of the present invention to solve the above-described problems, and now an object is to provide a curable composition for photo imprints excellent in the mold releasability, and in particular to provide a curable composition for photo imprints also excellent in the ink jettability.

Solution to Problem

After intensive studies aimed at solving the above-described problem, the present inventors found out that the ink jettability and mold releasability of the curable composition for photo imprints are improved, by introducing a non-polymerizable, fluorine-containing compound having a specific structure, as a mold releasing agent into the curable composition for photo imprints. The finding led us to propose the present invention.

The problems were solved by the solving means <1>, preferably by solving means <2> to <15> below.
<1> A curable composition for photo imprints, comprising:
  a polymerizable compound (A);
  a photo-polymerization initiator (B); and
  a mold releasing agent (C),
  the mold releasing agent (C) being represented by the formula (I) below:

[Chemical Formula 1]

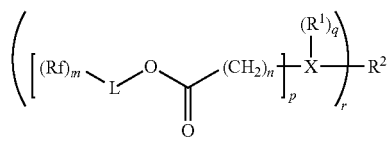

Formula (I)

(in the formula (I), Rf represents a $C_{1-8}$ fluorine-containing alkyl group having two or more fluorine atoms; m represents 1 or 2; L represents a single bond or divalent linking group; n represents 1 or 2; X represents a single bond, oxygen atom, sulfur atom, or nitrogen atom; $R^1$ represents a $C_{1-8}$ substituent (being free from polymerizable group); $R^2$ represents a hydrogen atom, $C_{1-8}$ substituent, or divalent linking group; p represents 1 or 2, q represents 0 or 1, and r represents 1 or 2; $R^1$ and $R^2$ may combine with each other to form a ring.)
<2> The curable composition for photo imprints of <1>, having one or more ether groups in the molecule as seen in the formula (I).
<3> The curable composition for photo imprints of <1> or <2>, having two or more ether groups, or having an ether group and an amino group, or having an ether group and a sulfide group, in the molecule as seen in formula (I).
<4> The curable composition for photo imprints of any one of <1> to <3>, wherein the mold releasing agent (C) is represented by any one of the formulae (II) to (V) below:

[Chemical Formula 2]

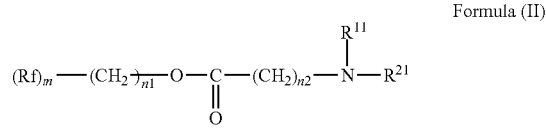

Formula (II)

(in the formula (II), Rf represents a $C_{1-8}$ fluorine-containing alkyl group having two or more fluorine atoms; m represents 1 or 2; n1 represents an integer of 0 to 4; n2 represents 1 or 2; Each of $R^{11}$ and $R^{21}$ represents a $C_{1-8}$ substituent (being free from polymerizable group); $R^{11}$ and $R^{21}$ may be same or different, or may combine with each other to form a ring;)

[Chemical Formula 3]

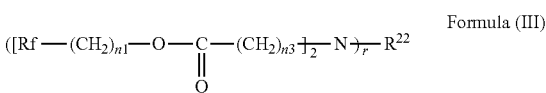

Formula (III)

(in the formula (III), Rf represents a $C_{1-8}$ fluorine-containing alkyl group having two or more fluorine atoms; n1 represents an integer of 0 to 4; n3 represents 1 or 2; r represents 1 or 2; $R^{22}$ represents a $C_{1-8}$ substituent (being free from polymerizable group), or divalent linking group;)

[Chemical Formula 4]

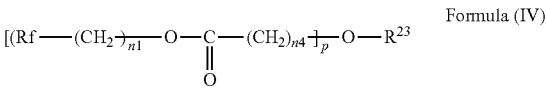

Formula (IV)

(in the formula (IV), Rf represents a $C_{1-8}$ fluorine-containing alkyl group having two or more fluorine atoms; n1 represents an integer of 0 to 4; n4 represents 1 or 2; p represents 1 or 2; $R^{23}$ represents a $C_{1-8}$ substituent (being free from polymerizable group), or divalent linking group;)

[Chemical Formula 5]

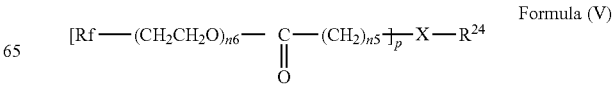

Formula (V)

(in the formula (V), Rf represents a $C_{1-8}$ fluorine-containing alkyl group having two or more fluorine atoms; n5 represents 1 or 2; n6 represents an integer of 1 to 10; p represents 1 or 2; X represents a single bond, oxygen atom, sulfur atom, or nitrogen atom; $R^{24}$ represents a hydrogen atom, or $C_{1-8}$ substituent, single bond (being free from polymerizable group.

5. The curable composition for photo imprints of any one of <1> to <4>, wherein in the formula (I), Rf has a terminal structure of ($CF_3$—) or ($HCF_2$—).

<6> The curable composition for photo imprints of any one of <1> to <5>, wherein in the formula (I), L is a single bond, $C_{1-12}$ alkylene group, or polyoxyethylene group.

<7> The curable composition for photo imprints of <4>, the mold releasing agent (C) represents the Formula (IV), wherein in the formula (IV), $R^{23}$ represents a $C_{2-20}$ polyoxyethylene group.

<8> The curable composition for photo imprints of any one of <1> to <6>, wherein the polymerizable compound (A) is a (meth)acrylate compound.

<9> The curable composition for photo imprints of any one of <1> to <8>, wherein the polymerizable compound (A) is a compound having an aromatic group.

<10>. The curable composition for photo imprints of any one of <1> to <9>, wherein the curable composition for photo imprints contains substantially no solvent.

<11> The curable composition for photo imprints of any one of <1> to <10>, wherein the curable composition for photo imprints has a viscosity at 23° C. of 15 mPa·s or smaller, and a surface tension of 25 to 35 mN/m.

<12> A method for forming a pattern, the method comprising:
coating the curable composition for photo imprints described in any one of <1> to <11> on a base, or on a mold having a fine pattern, and irradiating light onto the curable composition for photo imprints while being held between the mold and the base.

<13> The method for forming a pattern of <12>, wherein the curable composition for photo imprints is coated on the base or on the mold having a fine pattern by an ink jet process.

<14> A fine pattern obtained by the method described in <12> or <13>.

<15> A method for manufacturing a semiconductor device, the method using the fine pattern described in <14> as an etching mask.

Advantageous Effects of Invention

According to the present invention, it now becomes possible to provide a curable composition for photo imprints excellent in the mold releasability, and also to provide a curable composition for photo imprints excellent in the ink jettability.

DESCRIPTION OF EMBODIMENTS

The contents of the invention are described in detail hereinunder. Description of the configuration requirements described below, it is to be made on the basis of representative embodiments of the present invention, the present invention is not limited to such embodiments. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. The monomer in the context of the present invention is discriminated from oligomer and polymer, and is defined as any compound having a weight average molecular weight of 1,000 or smaller. In this specification, "functional group" refers to a group which participates in a polymerization reaction. "Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

Curable Composition for Photo Imprints of the Present Invention

The curable composition for photo imprints of the present invention (may simply be referred to as "the curable composition of the present invention" or "the composition of the present invention", hereinafter) contains a polymerizable compound (A), a photo-polymerization initiator (B), and a mold releasing agent (C).

Polymerizable Compound (A)

The polymerizable compound used for the curable composition of the present invention is not specifically limited so long as it does not depart from the spirit of the present invention, and may be exemplified by polymerizable unsaturated monomer having 1 to 6 groups each containing an ethylenic unsaturated bond; epoxy compound, oxetane compound; vinyl ether compound; styrene derivative; propenyl ether; and butenyl ether.

In this invention, it is also preferable to use, as the polymerizable monomer, a monofunctional polymerizable unsaturated monomer having one ethylenic unsaturated bond-containing group.

Examples of the polymerizable unsaturated monomer having one ethylenic unsaturated bond-containing group, which is preferably used in this invention, include methyl (meth)acrylate, ethyl (meth)acrylate, butyl (meth)acrylate, isobutyl (meth)acrylate, t-butyl (meth)acrylate, octyl (meth) acrylate, isooctyl (meth)acrylate, 2-ethylhexyl (meth)acrylate, lauryl (meth)acrylate, tridecyl (meth)acrylate, isomyristyl (meth)acrylate, cetyl (meth)acrylate, stearyl (meth) acrylate, cyclohexyl (meth)acrylate, isobornyl (meth) acrylate, dicyclopentanyl (meth)acrylate, dicyclopentenyl (meth)acrylate, dicyclopentanyloxyethyl (meth)acrylate, dicyclopentenyloxyethyl (meth)acrylate, adamantyl (meth) acrylate, methoxyethyl (meth)acrylate, ethoxyethyl (meth) acrylate, butoxyethyl (meth)acrylate, ethylcarbitol (meth) acrylate, 2-ethylhexylcarbitol (meth)acrylate, methoxytriethylene glycol (meth)acrylate, methoxypolyethylene glycol (meth)acrylate, methoxydipropylene glycol (meth)acrylate, methoxytripropylene glycol (meth)acrylate, glycidyl (meth)acrylate, 3-methyl-3-oxetanyl (meth)acrylate, tetrahydrofurfuryl (meth)acrylate, 2,2-dimethyl-4-(meth)acryloyloxymethyl dioxolane, 2-ethyl-2-methyl-4-(meth)acryloyloxymethyl dioxolane, 2-isobutyl-2-methyl-4-(meth)acryloyloxymethyl dioxolane, 2-cyclohexyl-2-methyl-4-(meth)acryloyloxymethyl dioxolane, α-(meth)acryloyloxy-γ-butyrolactone, β-(meth)acryloyloxy-γ-butyrolactone, 2-hydroxyethyl (meth)acrylate, 2-hydroxypropyl (meth)acrylate, 2-hydroxybutyl (meth)

acrylate, 4-hydroxybutyl (meth)acrylate, dipropylene glycol (meth)acrylate, polyethylene glycol (meth)acrylate, polypropylene glycol (meth)acrylate, polyethylene glycol-polypropylene glycol (meth)acrylate, benzyl (meth)acrylate, benzyl (meth)acrylate having a substituent on the aromatic ring (the substituent is preferably $C_{1-6}$ alkyl group, $C_{1-6}$ alkoxy group, or cyano group), 1- or 2-naphthyl (meth)acrylate, 1- or 2-naphthylmethyl (meth)acrylate, phenoxyethyl (meth)acrylate, cresol (meth)acrylate, phenoxydiethylene glycol (meth)acrylate, phenoxytetraethylene glycol (meth)acrylate, phenoxyhexaethylene glycol (meth)acrylate, phenoxypolyethylene glycol (meth)acrylate, p-cumylphenoxyethylene glycol (meth)acrylate, nonylphenoxypolyethylene glycol (meth)acrylate, nonylphenoxypolypropylene glycol (meth)acrylate, tribromophenyl (meth)acrylate, EO-modified tribromophenol (meth)acrylate, 2-(o-phenylphenoxy)ethyl (meth)acrylate, ethoxylated o-phenylphenol (meth)acrylate, (meth)acrylic acid, acrylic acid dimer, 2-acryloyloxyethyl acid phosphate, 2-(meth)acryloyloxyethyl succinic acid, 2-(meth)acryloyloxyethyl phthalic acid, 2-(meth)acryloyloxyethyl hexahydrophthalic acid, 2-(meth)acryloyloxypropyl phthalic acid, EO-modified succinic acid (meth)acrylate, (meth)acrylamide, N-isopropylacrylamide, N-t-butylacrylamide, diacetone acrylamide, N,N-dimethylacrylamide, N,N-diethylacrylamide, acryloylmorpholine, N-(2-hydroxyethyl)acrylamide, N-[3-(dimethylamino)propyl](meth)acrylamide, 2-acrylamide-2-methylpropanesulfonic acid, N-phenylmaleimide, N-cyclohexylmaleimide, N-vinylformamide, N-vinylpyrrolidone, N-vinylcaprolactam, N-vinylimidazole, and N-vinylcarbazole.

Among the monofunctional polymerizable monomers having ethylenic unsaturated bond, it is preferable to use monofunctional (meth)acrylate compound from the viewpoint of photo-curability, and more preferable to use monofunctional acrylate compound.

Among the monofunctional (meth)acrylate compound, it is preferable, from the viewpoint of dry etching resistance, to use monofunctional (meth)acrylate having an aromatic structure and/or alicyclic hydrocarbon structure, and more preferable to use monofunctional (meth)acrylate having an aromatic structure.

Among the monofunctional (meth)acrylates having an aromatic structure and/or alicyclic hydrocarbon structure, it is preferable to use benzyl (meth)acrylate, benzyl (meth)acrylate having a substituent on the aromatic ring (the substituent is preferably $C_{1-6}$ alkyl group, $C_{1-6}$ alkoxy group, or cyano group), phenoxyethyl (meth)acrylate, 1- or 2-naphthylmethyl (meth)acrylate, isobornyl (meth)acrylate, dicyclopentanyl (meth)acrylate, dicyclopentanyloxyethyl (meth)acrylate, or adamantyl (meth)acrylate; and it is particularly preferable to use benzyl acrylate having a substituent on the aromatic ring, phenoxyethyl acrylate, or 1- or 2-naphthylmethyl (meth)acrylate.

In this invention, it is also preferable to use, as the polymerizable monomer, a multifunctional polymerizable unsaturated monomer having two or more ethylenic unsaturated bond-containing groups.

The bifunctional polymerizable unsaturated monomer having two ethylenic unsaturated bond-containing groups, preferably used in this invention, is exemplified by ethylene glycol di(meth)acrylate, 1,2-propylene glycol di(meth)acrylate, 1,3-butanediol di(meth)acrylate, 1,4-butanediol di(meth)acrylate, neopentyl glycol di(meth)acrylate, 1,6-hexanediol di(meth)acrylate, 1,9-nonanediol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, polypropylene glycol di(meth)acrylate, triglycerol di(meth)acrylate, cyclohexane dimethanol di(meth)acrylate, norbornane dimethanol diacrylate, dimethylol dicyclopentane di(meth)acrylate, dimethylol tricyclodecane di(meth)acrylate, 1,3-adamantane diacrylate, o-, m-, p-benzene di(meth)acrylate, o-, m-, p-xylylene di(meth)acrylate, ethylene oxide-modified (referred to as "EO-modified", hereinafter) 1,6-hexanediol di(meth)acrylate, EO-modified neopentyl glycol diacrylate, propylene oxide-modified (referred to as "PO-modified", hereinafter) neopentyl glycol diacrylate, EO-modified tripropylene glycol di(meth)acrylate, EO-modified bisphenol-A di(meth)acrylate, PO-modified bisphenol-A di(meth)acrylate, EO-modified bisphenol-F di(meth)acrylate, divinylethylene urea, and divinylpropylene urea.

Among them, it is particularly preferable in this invention to use bifunctional (meth)acrylate such as neopentyl glycol di(meth)acrylate, 1,9-nonanediol di(meth)acrylate, tripropylene glycol di(meth)acrylate, tetraethylene glycol di(meth)acrylate, or o-, m-, p-xylylene di(meth)acrylate.

The multifunctional polymerizable unsaturated monomer having three or more ethylenic unsaturated bond-containing groups is exemplified by tris(acryloyloxyethyl)isocyanurate, glycerol tri(meth)acrylate, EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, pentaerythritol tetra(meth)acrylate, pentaerythritolethoxy tetra(meth)acrylate, ditrimethylolpropane tetra(meth)acrylate, dipentaerythritol hexa(meth)acrylate, dipentaerythritol penta(meth)acrylate, and dipentaerythritol poly(meth)acrylate.

Among them, it is preferable in this invention to use multifunctional (meth)acrylate such as tris(acryloyloxyethyl) isocyanurate, glycerol tri(meth)acrylate, trimethylolpropane tri(meth)acrylate, pentaerythritol tetra(meth)acrylate, or dipentaerythritol hexa (meth)acrylate.

Among the multifunctional polymerizable unsaturated monomer having two or more ethylenic unsaturated bonds, it is preferable in this invention to use multifunctional (meth)acrylate, from the viewpoint of photo-curability.

As the polymerizable monomer usable in this invention, it is also preferable to contain a polymerizable monomer compound having at least one of fluorine atom and silicon atom.

The polymerizable monomer used in this invention, having at least one of fluorine atom and silicon atom, is a compound having at least one group containing a fluorine atom, silicon atom, or, both of fluorine atom and silicon atom, together with at least one polymerizable functional group. The polymerizable functional group is preferably (meth)acryloyl group or epoxy group.

The group having fluorine atom is preferably a fluorine-containing group selected from fluorine-containing alkyl group and fluorine-containing polyether group.

The fluorine-containing alkyl group is preferably $C_{2-10}$ fluorine-containing alkyl group, and more preferably $C_{4-8}$ fluorine-containing alkyl group. Preferable examples of the fluorine-containing alkyl group include 2,2,2-trifluoroethyl group, 1H,1H-pentafluoropropyl group, 2H-hexafluoro-2-propyl group, 1H,1H-heptafluorobutyl group, 2-(perfluorobutyl) ethyl group, 3-(perfluorobutyl)propyl group, 3-(perfluorobutyl)-2-hydroxypropyl group, 6-(perfluorobutyl) hexyl group, 1H, 1H-undecafluorohexyl group, 2-(perfluorohexyl)ethyl group, 3-(perfluorohexyl)propyl group, 3-(perfluorohexyl)-2-hydroxypropyl group, 6-(perfluorohexyl)hexyl group, 1H,1H,3H-tetrafluoropropyl group, 1H,1H,5H-octafluoropentyl group, 1H,1H,7H-dodecafluoroheptyl group, and 1H, 1H, 9H-hexadecafluorononyl group.

The terminal of the fluorine-containing alkyl group preferably has a trifluoromethyl group structure. Provision of the trifluoromethyl group structure at the terminal assists demonstration of the effect of this invention only at a small amount of addition (for example, 5% by mass or less), and improves the line edge roughness after dry etching.

The fluorine-containing polyether group is exemplified by fluorine-containing polyether groups containing, as a repeating unit, trifluoropropylene oxide unit, perfluoroethylene oxide unit, or perfluoropropylene oxide unit. Similarly to the case of the fluorine-containing alkyl group described previously, the fluorine-containing polyether group is preferably any of fluorine-containing polyether group having trifluoromethyl group, and preferably any of fluorine-containing polyether group having perfluoropropylene oxide unit and/or fluorine-containing polyether group having a trifluoromethyl group at a terminal thereof.

Specific examples of the fluorine atom-containing polymerizable monomer used in this invention is enumerated below, without limiting this invention.

The fluorine atom-containing polymerizable monomer is exemplified by (meth)acrylates such as 2,2,2-trifluoroethyl (meth)acrylate, 1H,1H-pentafluoropropyl (meth)acrylate, 2H-hexafluoro-2-propyl (meth)acrylate, 1H,1H-heptafluorobutyl (meth)acrylate, 2-(perfluorobutyl)ethyl (meth)acrylate, 3-(perfluorobutyl)propyl (meth)acrylate, 3-(perfluorobutyl)-2-hydroxypropyl (meth)acrylate, 6-(perfluorobutyl)hexyl (meth)acrylate, 1H,1H-undecafluorohexyl (meth)acrylate, 2-(perfluorohexyl)ethyl (meth)acrylate, 3-(perfluorohexyl)propyl (meth)acrylate, 3-(perfluorohexyl)-2-hydroxypropyl (meth)acrylate, 6-(perfluorohexyl)hexyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, 1H,1H,9H-hexadecafluorononyl (meth)acrylate, 2,2,3,3,4,4-hexafluoropentane-1,5-diol di(meth)acrylate, and 2,2,3,3,4,4,5,5-octafluorohexane-1,6-diol di(meth)acrylate. Also preferable are epoxy compounds such as 3-perfluorobutyl-1,2-epoxypropane, 3-perfluorohexyl-1,2-epoxypropane, 3-(1H,1H,5H-octafluoropentyloxy)-1,2-epoxypropane, 3-(1H,1H,7H-dodecafluoroheptyloxy)-1,2-epoxypropane, 3-(1H,1H,9H-hexadecafluorononyloxy)-1,2-epoxypropane, 1,4-bis(2',3'-epoxypropyl)perfluorobutane, 2,2,3,3,4,4-hexafluoropentane-1,5-diol diglycidyl ether, and 2,2,3,3,4,4,5,5-octafluorohexane-1,6-diol diglycidyl ether.

Among them, 2-(perfluorohexyl)ethyl (meth)acrylate, 3-(perfluorohexyl)propyl (meth)acrylate, and 6-(perfluorohexyl)hexyl (meth)acrylate are particularly preferable from the viewpoints of mold releasability and compatibility with the composition.

While the content of the polymerizable monomer having at least one of fluorine atom and silicon atom, in the curable composition for imprints of this invention, is not specifically limited, it is preferably 0.1 to 20% by mass of the total polymerizable monomer from the viewpoints of mold releasability and compatibility, more preferably 0.2 to 15% by mass, furthermore preferably 0.5 to 10% by mass, and particularly 0.5 to 5% by mass.

Specific examples of the polymerizable compound (A) are exemplified by the polymerizable compounds described in paragraphs to [0098] of JP-A-2011-231308, the content of which is incorporated into this specification.

The polymerizable compound used for the curable composition of the present invention is preferably (meth)acrylate compound, and particularly from the viewpoint of etching resistance, it is more preferably (meth)acrylate compound having an alicyclic hydrocarbon group and/or aromatic group, and more preferably (meth)acrylate compound having an aromatic group. It may also contain a polymerizable compound having a silicon atom and/or fluorine atom. It is, however, possible in the present invention to achieve low releasability by an embodiment where the compound represented by the formula (I) is added, even if a polymerizable compound having a silicon atom and/or fluorine atom is substantially not contained. "Substantially not contained" now means, for example, that the content thereof is 1% by mass or less of the content of the compound represented by the formula (I).

Among the whole components of the polymerizable compound contained in the curable composition of the present invention, the total content of the polymerizable compound having an alicyclic hydrocarbon group and/or aromatic group preferably accounts for 30 to 100% by mass of the whole polymerizable compound, more preferably 50 to 100% by mass, and furthermore preferably 70 to 100% by mass.

As the polymerizable compound, the (meth)acrylate polymerizable compound having an aromatic group preferably accounts for 30 to 100% by mass of the total content of the whole polymerizable component, preferably 50 to 100% by mass, and furthermore preferably 70 to 100% by mass.

Only a single species of the polymerizable compound may be used, or two or more species thereof may be used in combination.

In a particularly preferable embodiment, polymerizable compound (A1) explained below accounts for 0 to 80% by mass of the whole polymerizable components, and preferably 0 to 50% by mass; and polymerizable compound (A2) explained below accounts for 20 to 100% by mass of the whole polymerizable components, and preferably 50 to 100% by mass:

(A1) polymerizable compound having one aromatic group (preferably a phenyl group or naphthyl group, and more preferably naphthyl group) and one (meth)acrylate group; and (A2) polymerizable compound having one aromatic group (preferably phenyl group or naphthyl group, and more preferably phenyl group) and two (meth)acrylate groups.

Photo-Polymerization Initiator (B)

The curable composition of the present invention contains a photo-polymerization initiator. The photo-polymerization initiator used in the present invention may be anything so long as it can produce an active species capable of polymerizing the polymerizable compound described above under photo-irradiation. The photo-polymerization initiator is preferably a radical polymerization initiator or cationic polymerization initiator. The radical polymerization initiator is more preferable. In the present invention, a plurality of photo-polymerization initiators may be used in combination.

As the radical photo-polymerization initiator used in the present invention, any of commercially available initiators is selectable. Examples are such as the radical photo-polymerization initiator typically described in paragraph [0091] of JP-A-2008-105414, which are preferably used. Among them, acetophenone-based compound, acylphosphine oxide-based compound and oxime ester-based compound are preferable from the viewpoints of curing sensitivity and absorption characteristics.

It is also preferable to use two or more species of photo-polymerization initiators in combination. For the case where two or more species are used in combination, it is preferable to use two or more species of radical polymerization initiators in combination. Specific combinations are exemplified by Darocure® 1173 and Irgacure® 907; Darocure 1173 and Lucirin® TPO; Darocure 1173 and Irgacure® 819; Darocure 1173 and Irgacure® OXE01; Irgacure 907 and Lucirin TPO; and Irgacure 907 and Irgacure 819. With these combinations, the exposure margin is expandable.

Compositional ratio (by mass) of the combined photo-polymerization initiators is preferably 9:1 to 1:9, more preferably 8:2 to 2:8, and furthermore preferably 7:3 to 3:7.

Note that "light" in the context of the present invention includes not only lights in the ultraviolet, near-ultraviolet, far-ultraviolet, visible and infrared regions, and electromagnetic wave, but also includes radioactive rays. The radioactive rays typically include microwave, electron beam, EUV and X-ray. Laser lights such as 248-nm excimer laser, 193-nm excimer laser and 172-nm excimer laser are usable. These lights may be monochromatic (single-wavelength) obtained after passing through an optical filter, or may contain a plurality of lights of different wavelengths (compound light).

The content of the photo-polymerization initiator used for the present invention, relative to whole components excluding solvent, is typically 0.01 to 15% by mass, preferably 0.1 to 10% by mass, and more preferably 0.5 to 7% by mass. When two or more species of photo-polymerization initiators are used, the total amount falls in these ranges. The content of the photo-polymerization initiator is preferably set to 0.01% by mass or above, in expectation of improving tendencies of sensitivity (fast curability), resolution, line edge roughness and film strength. The content of the photo-polymerization initiator is preferably set to 15% by mass or below, in expectation of improving tendencies of light transmissivity, coloration and handleability.

Mold Releasing Agent (C)

In the curable composition of the present invention, contained is the mold releasing agent (C) represented by the formula (I) below. By using such mold releasing agent, the ink jettability and the mold releasability of the curable composition of the present invention may be improved.

[Chemical Formula 6]

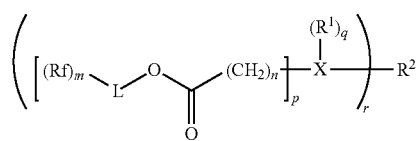

Formula (I)

(In the formula (I), Rf represents a $C_{1-8}$ fluorine-containing alkyl group having two or more fluorine atoms. m represents 1 or 2. L represents a single bond or divalent linking group. n represents 1 or 2. X represents a single bond, oxygen atom, sulfur atom, or nitrogen atom. $R^1$ represents a $C_{1-8}$ substituent (being free from a polymerizable group). $R^2$ represents a hydrogen atom, $C_{1-8}$ substituent, or divalent linking group. p represents 1 or 2, q represents 0 or 1, and r represents 1 or 2. $R^1$ and $R^2$ may combine with each other to form a ring.)

In the formula (I), Rf is a $C_{1-8}$ fluorine-containing alkyl group having two or more fluorine atoms, which may be any of straight, branched and cyclic alkyl group, wherein straight-chain or branched akyl group is preferable. Rf more preferably has 2 to 8 carbon atoms, furthermore preferably has 4 to 8 carbon atoms, and particularly has 4 to 6 carbon atoms. Rf preferably has ($CF_3$—) or ($HCF_2$—) at a terminal thereof. Ratio of substitution by fluorine atoms in Rf is preferably 50 to 100%, more preferably 60 to 100%, and furthermore preferably 80 to 100%. Now the ratio of substitution by fluorine atoms means a percentage (%) of hydrogen atoms in the $C_{1-8}$ alkyl group, having been substituted by fluorine atoms.

Rf is exemplified by trifluoromethyl group, pentafluoroethyl group, heptafluoropropyl group, nonafluorobutyl group, tridecafluorohexyl group, difluoromethyl group, 2H-tetrafluoroethyl group, 3H-hexafluoropropyl group, 2H-hexafluoropropyl group, 1H-hexafluoroisopropyl group, 4H-octafluorobutyl group, 6H-dodecafluorohexyl group, and 8H-hexadecafluorooctyl group. Among them, nonafluorobutyl group, tridecafluorohexyl group, and 1H-hexafluoroisopropyl group are preferable, and tridecafluorohexyl group is more preferable.

In the formula (I) L represents a single bond or divalent linking group.

The divalent linking group is exemplified by divalent groups such as alkylene group, arylene group, —O—, —S—, —NR—, —CO—, —COO—, —NRCO— and —$SO_2$—; and divalent groups configured by combining these groups, where R represents a hydrogen atom or $C_{1-4}$ alkyl group.

Specific examples of the divalent linking group include methylene group, ethylene group, propylene group, butylene group, hexylene group, cyclohexylene group, 2-hydroxy-1, 3-propylene group, 1,4-phenylene group, 1,4-naphthylene group, 4,4'-biphenylene group, 3,6-dioxaoctane-1,8-diyl group, 4,7-dioxadecane-1,10-diyl group, polyoxyethylene group and polyoxypropylene group. Among them, methylene group, ethylene group and polyoxyethylene group are preferable, and ethylene group is more preferable. The polyoxyethylene group and the polyoxypropylene group represent groups derived from polyoxyethylene and polyoxypropylene, excluding hydroxy groups at the both terminals thereof, respectively.

In the formula (I), X represents a single bond, O, S, or N, preferably O or N, and more preferably N. m represents 1 or 2, and more preferably 1. p represents 1 or 2, and more preferably 1. q represents 0 or 1, and more preferably 0. r represents 1 or 2, and more preferably In the formula (I), $R^1$ represents a $C_{1-8}$ substituent (being free from polymerizable group).

The $C_{1-8}$ substituent is exemplified by $C_{1-8}$ substituted or unsubstituted alkyl group, or, group which is configured by combination of $C_{1-8}$ substituted or unsubstituted alkylene group with —O— and has a hydrogen atom at a therminal thereof. In particular, $R^1$ preferably has a methyl group at a terminal thereof. While $R^1$ may have any of straight-chain, branched and cyclic group, it preferably has a straight-chain group.

For example, the $C_{1-8}$ substituent is exemplified by straight-chain or branched alkyl group, cycloalkyl group, and aryl group. These groups may have a substituent, and preferably has an alkoxy group. $R^1$ is exemplified by methyl group, ethyl group, n-propyl group, isopropyl group, n-butyl group, isobutyl group, tert-butyl group, n-pentyl group, isopentyl group, neopentyl group, hexyl group, cyclopentyl group, cyclohexyl group, phenyl group, benzyl group, phenethyl group, 2-hydroxyethyl group, 2-hydroxypropyl group, 2-methoxyethyl group, 2-ethoxyethyl group, 2-(2-methoxyethoxy) ethyl group, methoxycarbonyl group, methoxycarbonylmethyl group, 4-methoxyphenyl group, and 4-methoxybenzyl group. Among them, methyl group, 2-methoxyethyl group and 2-(2-methoxyethoxy) ethyl group are preferable, and 2-methoxyethyl group is more preferable.

In the formula (I), $R^2$ represents hydrogen atom, $C_{1-8}$ substituent or divalent linking group (being free from polymerizable group).

The $C_{1-8}$ substituent is preferably $C_{1-8}$ substituted or unsubstituted alkyl group, or, group configured by combining —(CH$_2$)$_t$— (t is an integer of 1 to 8) with —O— and/or —C(=O)— and having a hydrogen atom at a terminal thereof, and more preferably the group configured by combining —(CH$_2$)$_t$— (t is an integer of 1 to 8) with —O— and/or —C(=O)— and having a hydrogen atom a terminal thereof. In particular, $R^2$ preferably has a methyl group at a terminal thereof. While $R^2$ may have any of straight-chain, branched and cyclic group, it preferably has the straight-chain group.

For example, the $C_{1-8}$ substituent is the same as to the $C_{1-8}$ substituent in $R^1$ in the formula (I) described above, and among them, 2-methoxyethyl group, 2-(2-methoxyethoxy) ethyl group and methoxycarbonylmethyl group are preferable, and 2-methoxyethyl group is more preferable.

The divalent linking group is the same as L in the formula (I) described above, and among them, —O—, 3,6-dioxaoctane-1,8-diyl group, 4,7-dioxadecane-1,10-diyl group and polyoxyethylene group are preferable, and polyoxyethylene group is more preferable.

In the formula (I), it is preferable that each of $R^1$ and $R^2$ is independently configured by one or more species of atoms selected from carbon atom, oxygen atom and hydrogen atom.

In the formula (I), each of $R^1$ and $R^2$ is independently configured by one or more species of atoms selected from carbon atom, oxygen atom and hydrogen atom. In other words, $R^1$ and $R^2$ preferably do not contain constitutive atoms other than carbon atom, oxygen atom and hydrogen atom. It is also preferable for $R^1$ and $R^2$ to combine with each other to form a ring. The cyclic structure participated by X, $R^1$ and $R^2$ is exemplified by pyrrolidinyl group, piperidinyl group and morpholinyl group. Among them, morpholinyl group is more preferable.

In the formula (I), $R^1$ and $R^2$ are free from polymerizable group. The polymerizable group in this context is exemplified by (meth)acryl ester group, vinyl ether group, and epoxy group. If any polymerizable group is contained in $R^1$ or $R^2$, the curable composition of the present invention unfortunately degrades the ink jetttability and mold releasability.

The mold releasing agent (C) preferably has one or more ether groups in the molecule, and more preferably has two or more ether groups, has both of ether group and amino group, or has both of ether group and sulfide group. In the formula (I), it is more preferable that X represents a nitrogen atom, and $R^1$ and/or $R^2$ have ether group, and is particularly preferable that a structure configured by X, $R^1$ and $R^2$ is a morpholinyl group.

Preferable embodiments of the mold releasing agent (C) will be explained below. The first preferable embodiment of the mold releasing agent (C) is represented by the formula (II) below:

[Chemical Formula 7]

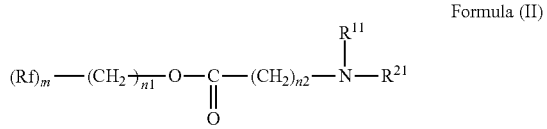

Formula (II)

(in the formula (II), Rf represents a $C_{1-8}$ fluorine-containing alkyl group having two or more fluorine atoms. m represents 1 or 2. n1 represents an integer of 0 to 4. n2 represents 1 or 2. Each of $R^{11}$ and $R^{21}$ represents a $C_{1-8}$ substituent (being free from polymerizable group). $R^{11}$ and $R^{21}$ may be the same or different to each other, and may combine with each other to form a ring.)

In the formula (II), Rf is the same as Rf in the formula (I) described above, associated with the same preferable ranges.

In the formula (II), m represents 1 or 2, and more preferably 1. In the formula (II), n1 represents an integer of 0 to 4, and preferably 1 or 2. In the formula (II), n2 represents 1 or 2, and preferably 2.

In the formula (II), $R^{11}$ represents a $C_{1-8}$ substituent, and is preferably a $C_{1-8}$ substituted or unsubstituted alkyl group, or, a group based on combination of —(CH$_2$)$_{t2}$— (t2 is an integer of 1 to 8, and preferably an integer of 1 to 4) with —O— and/or —C(=O)— and having a hydrogen atom at a terminal thereof; and more preferably a group based on combination of —(CH$_2$)$_{t2}$— (t2 is an integer of 1 to 8, and preferably an integer of 1 to 4) with —O— and having a hydrogen atom at a terminal thereof. It is particularly preferable that $R^{11}$ has a methyl group at a terminal thereof. Specific examples of $R^{11}$ are the same as the examples of the $C_{1-8}$ substituent of $R^1$ in the formula (I) described above, associated with the same preferable ranges.

In the formula (II), $R^{21}$ represents a $C_{1-8}$ substituent; and preferably a $C_{1-8}$ substituted or unsubstituted alkyl group, or, a group based on a combination of —(CH$_2$)$_{t3}$— (t3 is an integer of 1 to 8, and preferably an integer of 1 to 4), with —O— and/or —C(=O)— and having a hydrogen atom at a terminal thereof. It is particularly preferable that $R^{21}$ has a methyl group at a terminal thereof. $R^{21}$ may have any of straight-chain, branched and cyclic group, wherein a straight chain group is preferable. Specific examples of $R^{21}$ are the same as the examples of the $C_{1-8}$ substituent represented by $R^2$ in the formula (I) above, associated with the same preferable ranges.

In the formula (II), $R^{11}$ and $R^{21}$ may be same or different, and may combine with each other to form a ring, where $R^{11}$ and $R^{21}$ preferably combine with each other to form a ring. In particular, $R^{11}$ and $R^{21}$ preferably combine with each other to form a morpholinyl group participated by N, $R^{11}$ and $R^{21}$.

Note that each of $R^{11}$ and $R^{21}$ in the formula (II) is free from a polymerizable group, similarly as in the formula (I) above.

The second preferable embodiment of the mold releasing agent (C) is represented by the formula (III) below:

[Chemical Formula 8]

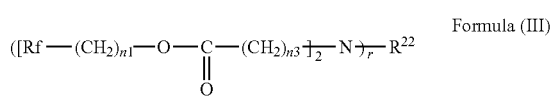

Formula (III)

(in the formula (III), Rf represents a $C_{1-8}$ fluorine-containing alkyl group having two or more fluorine atoms. n1 represents an integer of 0 to 4. n3 represents 1 or 2. r represents 1 or 2. $R^{22}$ represents a substituent (being free from polymerizable group), or divalent linking group.)

In the formula (III), Rf and r are the same as Rf and r in the formula (I) described above, associated with the same preferable ranges.

In the formula (III), n1 represents an integer of 0 to 4, and preferably an integer of 0 to 2. In the formula (III), n3 represents 1 or 2, and preferably 2.

In the formula (III), $R^{22}$ represents a $C_{1\text{-}8}$ substituent or divalent linking group.

The $C_{1\text{-}8}$ substituent is the same as the $C_{1\text{-}8}$ substituent of $R^2$ in the formula (I) described above, preferably 2-methoxyethyl group, 2-(2-methoxyethoxy)ethyl group or methoxycarbonylmethyl group, and more preferably 2-methoxyethyl group or 2-(2-methoxyethoxy)ethyl group.

The divalent linking group is the same as L in the formula (I) described above, and is preferably for example —O—, 3,6-dioxaoctane-1,8-diyl group, 4,7-dioxadecane-1,10-diyl group or polyoxyethylene group, and is more preferably 4,7-dioxadecane-1,10-diyl group.

Note that $R^{22}$ in the formula (III) is free from a polymerizable group.

The third preferable embodiment of the mold releasing agent (C) is represented by the formula (IV) below:

[Chemical Formula 9]

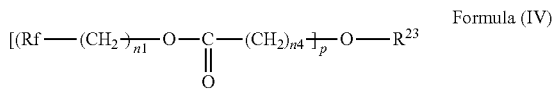

Formula (IV)

(in the formula (IV), Rf represents a $C_{1\text{-}8}$ fluorine-containing alkyl group having two or more fluorine atoms. n1 represents an integer of 0 to 4. n4 represents 1 or 2. p represents 1 or 2. $R^{23}$ represents a $C_{1\text{-}8}$ substituent (being free from polymerizable group), or divalent linking group.

In the formula (IV), Rf is the same as Rf in the formula (I) described above, associated with the same preferable ranges.

In the formula (IV), n1 represents an integer of 0 to 4, and preferably an integer of 0 to 2, more preferably an integer of 1 or 2, furthermore preferably an integer of 2. In the formula (IV), n4 represents 1 or 2, and preferably 1. In the formula (IV), p represents 1 or 2, and preferably 2.

In the formula (IV), $R^{23}$ represents a $C_{1\text{-}8}$ substituent or divalent linking group.

The $C_{1\text{-}8}$ substituent is the same as the $C_{1\text{-}8}$ substituent of $R^2$ in the formula (I) described above, and is preferably for example 2-methoxyethyl group, 2-(2-methoxyethoxyl)ethyl group, or methoxycarbonylmethyl group, and is more preferably 2-methoxyethyl group or 2-(2-methoxyethoxyl)ethyl group.

The divalent linking group is the same as L in the formula (I) described above, and is preferably —O—, 3,6-dioxaoctane-1,8-diyl group, 4,7-dioxadecane-1,10-diyl group or polyoxyethylene group, and is more preferably 3,6-dioxaoctane-1,8-diyl group or polyoxyethylene group, furthermore preferably polyoxyethylene group. The number of repeating units in the polyoxyethylene group is preferably 2 to 20, more preferably 5 to 18, furthermore preferably 8 to 15, and particularly 10 to 13. By using two or more repeating units, the composition tends to be improved in the surface tension, to thereby improve the ink jettability, and also tends to improve the adsorbability to mold, to thereby decrease the mold releasing force. Meanwhile, by using 20 or smaller number of repeating units, the viscosity of the composition tends to reduce, to thereby improve the ink jettability.

Note that $R^{23}$ in the formula (IV) is free from a polymerizable group, similarly as in formulae (I) to (III) described above.

The fourth preferable embodiment of the mold releasing agent (C) is represented by the formula (V) below:

[Chemical Formula 10]

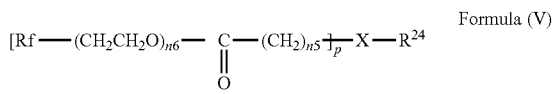

Formula (V)

(in the formula (V), Rf represents a $C_{1\text{-}8}$ fluorine-containing alkyl group having two or more fluorine atoms. n5 represents 1 or 2. n6 represents an integer of 1 to 10. p represents 1 or 2. X represents a single bond, oxygen atom, sulfur atom, or nitrogen atom. $R^{24}$ represents a hydrogen atom, or $C_{1\text{-}8}$ substituent (being free from polymerizable group).

In the formula (V), Rf is the same as Rf in the formula (I) above, associated with the same preferable ranges.

In the formula (V), n5 represents 1 or 2, and is preferably 1. In the formula (V), n6 represents an integer of 1 to 10, and is preferably an integer of 3 to 5. In the formula (V), p represents 1 or 2.

In the formula (V), X represents a single bond, oxygen atom, sulfur atom, or nitrogen atom, and is preferably a single bond or oxygen atom.

In the formula (V), $R^{24}$ represents a hydrogen atom, divalent linking group or $C_{1\text{-}8}$ substituent.

The divalent linking group is the same as L in the formula (I) above, and is preferably for example —O—, 3,6-dioxaoctane-1,8-diyl group, 4,7-dioxadecane-1,10-diyl group or polyoxyethylene group, and is more preferably —O—.

The $C_{1\text{-}8}$ substituent is the same as the $C_{1\text{-}8}$ substituent $R^2$ in the formula (I) above, and is preferably for example methyl group, 2-methoxyethyl group, 2-(2-methoxyethoxy)ethyl group or methoxycarbonylmethyl group, and is more preferably methyl group.

Note that $R^{24}$ in the formula (V) is free from a polymerizable group, similarly as in the formulae (I) to (IV) described above.

Preferable and specific examples of the mold releasing agent (C) are exemplified by compounds C-1 to C-24 below. The mold releasing agent used in the present invention are, however, not limited to these compounds.

[Chemical Formula 11]

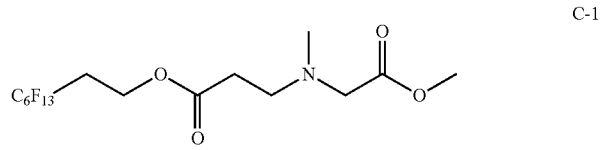

C-1

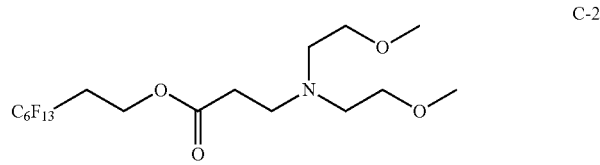

C-2

-continued
C-3
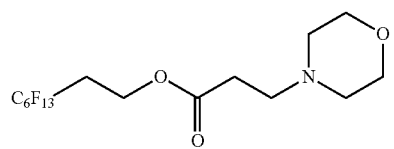
C-4
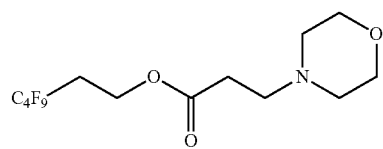
C-5
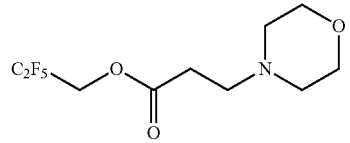
C-6
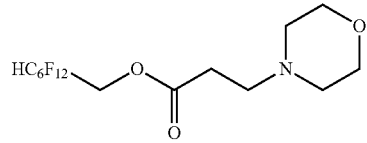
C-7
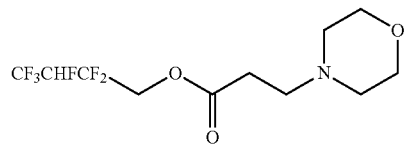
C-8
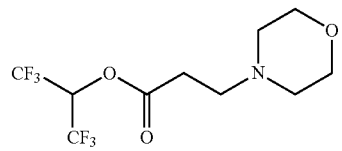
C-9
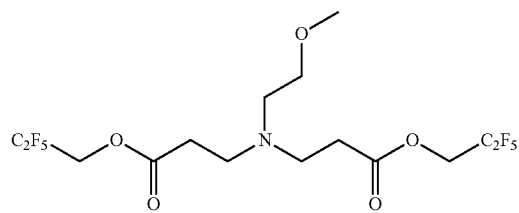
C-10
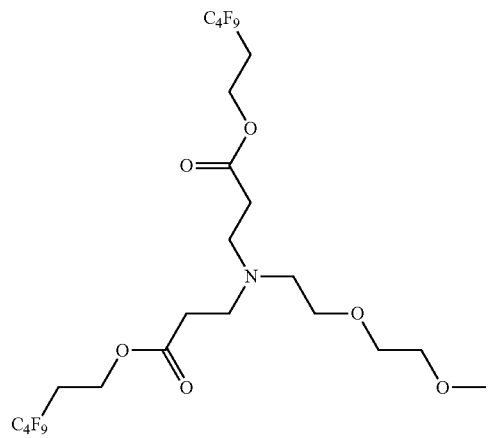
C-11
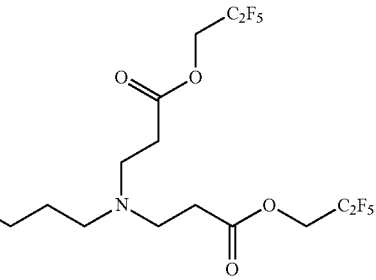
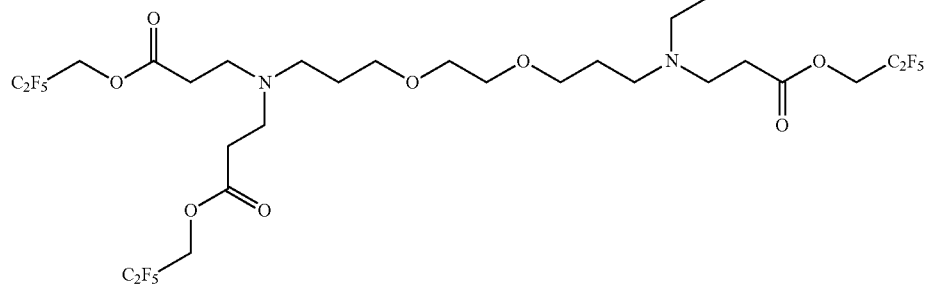
[Chemical Formula 12]
C-12
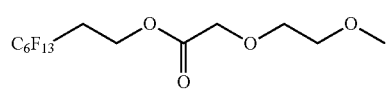
C-13
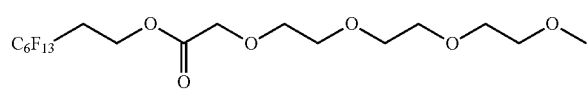
C-14
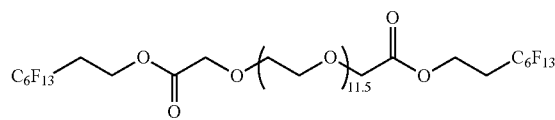
C-15

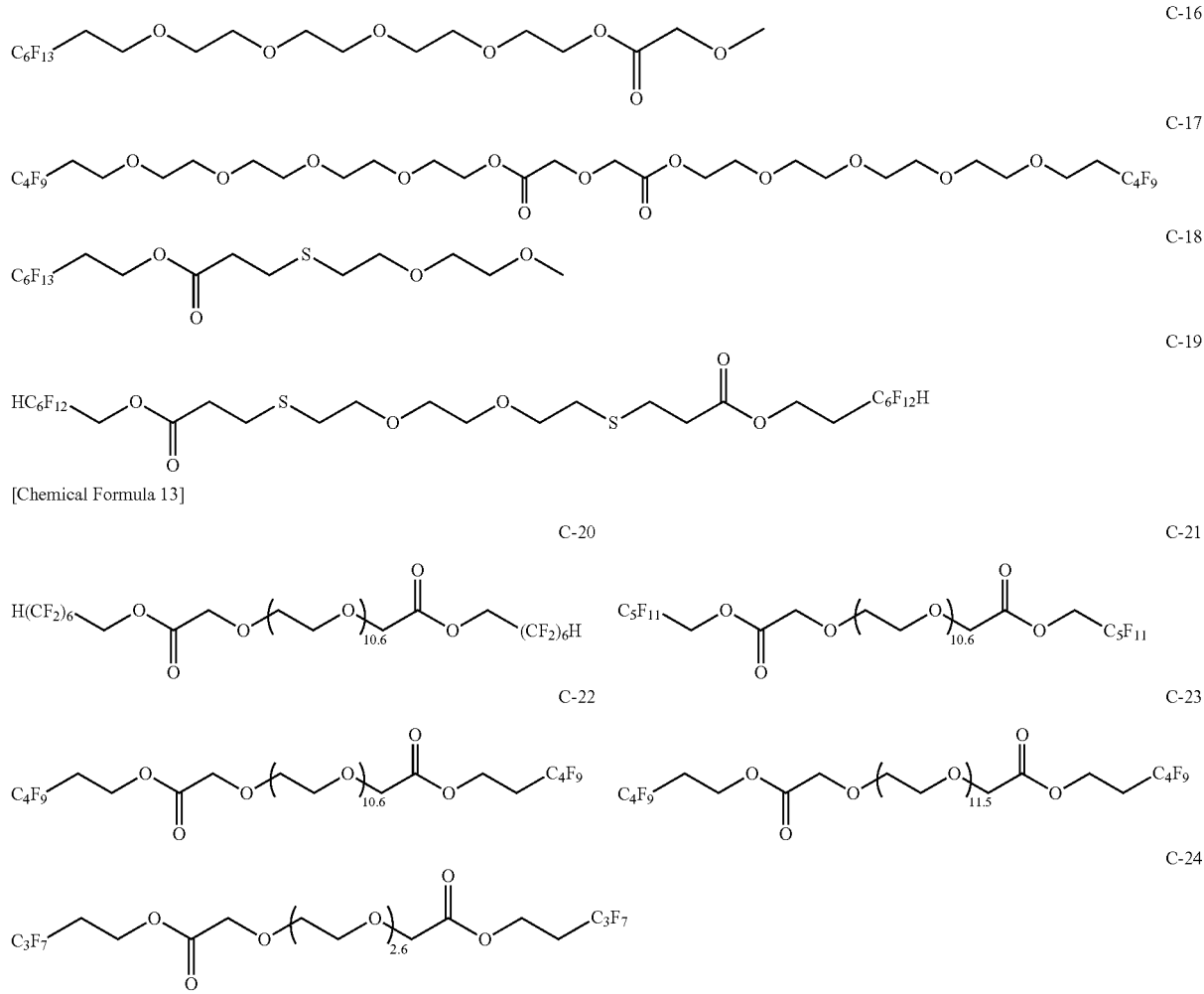

The mold releasing agent (C) preferably has a molecular weight of 2000 or smaller, more preferably 1500 or smaller, and furthermore preferably 1000 or smaller. The lower limit value is 300 or larger, although not specifically limited.

The content of the mold releasing agent (C) in the curable composition of the present invention is preferably 0.1 to 10% by mass, more preferably 2 to 9% by mass, furthermore preferably 4 to 8% by mass. The mold releasability tends to advantageously improve if the content of the mold releasing agent (C) is set to 0.1% by mass or more. The pattern profile tends to advantageously improve if the content of the mold releasing agent (C) is set to 10% by mass or less. Only a single species of the mold releasing agent (C) may be used, or two or more species thereof may be used in combination.

Polymerization Inhibitor

The curable composition of the present invention preferably contains a polymerization inhibitor. The content of the polymerization inhibitor is 0.001 to 1% by mass of the total polymerizable monomers, more preferably 0.005 to 0.5% by mass, and furthermore preferably 0.008 to 0.05% by mass. By adding an appropriate amount of the polymerization inhibitor, time-dependent changes in the viscosity may be suppressed while keeping a high level of curing sensitivity. The polymerization inhibitor may be added when the polymerizable monomer is manufactured, or may be added later to the curable composition of the present invention. Specific examples of the polymerization inhibitor are exemplified by the polymerization inhibitor described in paragraph [0121] of JP-A-2012-169462, the content of which is incorporated into this specification. Only a single species of the polymerization inhibitor may be used, or two or more species thereof may be used in combination.

Surfactant

The curable composition of this invention may optionally contain a surfactant. The surfactant, generally having a hydrophobic moiety and a hydrophilic moiety within a molecule, is known as a substance capable of distinctively changing properties of interface, only with a small amount of addition. The surfactant used in this invention has a hydrophobic moiety and a hydrophilic moiety within a molecule, and is capable of distinctively reducing the surface tension of the curable composition only with a small amount of addition. For example, an amount of addition of 1% by mass relative to the curable composition may reduce the surface tension of the curable composition from 40 mN/m down to 30 mN/m or below. Expectable effects of incorporating the surfactant into the curable composition of this invention include improvement in uniformity of coating, and improvement in mold releasability.

The surfactant usable in the present invention is preferably nonionic surfactant, and preferably contains at least one species selected from fluorine-containing surfactant, silicon-containing surfactant and fluorine/silicon-containing surfactant, and is most preferably fluorine-containing nonionic surfactant. Now the "fluorine/silicon-containing surfactant" means a surfactant which has both features of fluorine-containing surfactant and silicon-containing surfactant.

The fluorine-containing nonionic surfactant usable in the present invention is exemplified, in trade names, by Fluorad (Sumitomo-3M, Ltd.), Megafac (DIC Corporation), Surflon (AGC Seimi Chemical Co., Ltd.), Unidyne (Daikin Industries, Ltd.), Ftergent (NEOS Co., Ltd.), Eftop (Mitsubishi Materials Electronic Chemicals Co., Ltd.), Polyflow (Kyoeisha Chemical Co., Ltd.), KP (Shin-Etsu Chemical Co., Ltd.), Troysol (Troy Chemical Corporation), PolyFox (OMNOVA Solutions Inc.), and Capstone (DuPont).

Content of the surfactant used in the present invention is, for example, 0.001 to 5% by mass of the whole composition, preferably 0.002 to 4% by mass, and more preferably 0.005 to 3% by mass. When two or more species of the surfactants are used, the total content falls in the above ranges. With the content of surfactant adjusted in the range from 0.001 to 5% by mass of the curable composition of the present invention, an effect of uniformity of coating is improved, and the mold transferability is less likely to degrade due to excess of the surfactant.

Only a single species of the surfactant may be used, or two or more species thereof may be used in combination.

In the present invention, by mixing the compound represented by the formula (I), even an embodiment substantially not containing the surfactant may achieve a low mold releasing force. Now the phrase "substantially not containing" means, for example, that the content is 1% by mass or less of the content of the compound represented by the formula (I).

Other Components

The curable composition of the present invention may optionally contain, other than the components described above, photo-sensitizer, antioxidant, UV absorber, photostabilizer, age resistor, plasticizer, adherence modifier, thermal polymerization initiator, photobase generator, colorant, inorganic particle, elastomer particle, basic compound, photoacid generator, photoacid breeder, chain transfer agent, antistatic agent, fluidity modifier, defoaming agent, and dispersion aid. Specific examples of these components are exemplified by the components described in paragraphs [0092] to [0093], and paragraphs [0113] to [0137] of JP-A-2008-105414, the contents of which are incorporated into this specification.

In the present invention, by mixing the compound represented by the formula (I), even embodiments such as substantially not containing silane coupling agent having a perfluoro group, or not containing polymerizable compound having an alkyl group containing two or more fluorine atoms, may achieve a low mold releasing force. In addition, by substantially not containing the silane coupling agent having a perfluoro group, the present invention successfully prevents the curable composition from degrading in the shelf stability, and suppresses defects in imprinted pattern. The phrase "substantially not containing" means, for example, that the content is 1% by mass or less of the content of the compound represented by the formula (I).

Solvent

While solvent may be used for the curable composition of the present invention, the content of which is preferably 5% by mass or below, more preferably 3% by mass or below, and in particular, substantially none. A small amount of addition of solvent is preferable, since the curable composition of the present invention, when coated by the ink jet process on a base, may be prevented from varying in the viscosity due to volatilization of the solvent.

As described above, while the curable composition of the present invention does not always contain the solvent, the solvent may be added arbitrarily for the purpose of finely controlling the viscosity of composition. Solvent preferably used for the curable composition of the present invention is any of solvents generally used for curable composition for photo imprints and photoresist, and may be any solvent which is capable of allowing therein uniformly dissolving or dispersing the compound used in the present invention, and does not react with these components, without special limitation. The solvent usable in the present invention are exemplified by the solvents described in paragraph [0088] of JP-A-2008-105414, the content of which is incorporated into this specification.

Only a single species of the solvent may be used, or two or more species thereof may be used in combination.

The curable composition of the present invention may be prepared by mixing the individual components described above. Mixing and dissolution of the curable composition of the present invention is generally carried out in the range from 0° C. to 100° C. The mixing of the individual components is preferably followed by filtration through a filter with a pore size of 0.003 µm to 5.0 µm. The filtration may be a multi-stage process, or may be repeated a number of times. The filtrate may be re-filtered. Filter material used for the filtration include polyethylene resin, polypropylene resin, fluorine-containing resin and nylon resin, but not specifically limited thereto.

The curable composition of the present invention preferably has a viscosity at 23° C. of 15 mPa·s or smaller, and a viscosity at 23° C. of 12 mPa·s or smaller. With these ranges, the pattern formability may be improved. To the curable composition of the present invention, it is preferable to add, as the polymerizable compound (A), a substance capable of acting as a reactive diluent, in order to reduce the viscosity as described above while keeping the content of solvent to a low level. The polymerizable compound capable of acting the reactive diluent is exemplified by monofunctional (meth)acrylate.

The curable composition of the present invention preferably has a surface tension in the range from 25 to 35 mN/m, and more preferably from 27 to 34 mN/m. In these ranges, smoothness of the surface may be improved. In particular, the curable composition of the present invention has a viscosity at 23° C. of 15 mPa·s or smaller, and a surface tension of 25 to 35 mN/m.

Method for Forming a Pattern

The method for forming a pattern (pattern transfer method) using the curable composition of the present invention will be detailed below. In the method for forming a pattern of the present invention, first, the curable composition of the present invention is coated over a base or a mold having a fine pattern, and the curable composition of the present invention is then irradiated with light while being held between the mold and the base.

Method for coating the curable composition of the present invention over the base is exemplified by the methods for coating publicly known, such as dip coating, air knife coating, curtain coating, wire bar coating, gravure coating, extrusion coating, spin coating, slit scan coating and ink jet process, by which a coated film or liquid droplets may be arranged on the base. Since the curable composition of the present invention contains the mold releasing agent (C)

represented by the formula (I) above, so that it can ensure a good ink jettability when used in the ink jet process.

In the exposure of light, the illuminance is preferably controlled in the range from 1 mW/cm$^2$ to 200 mW/cm$^2$. An illuminance of 1 mW/cm$^2$ or larger will fortunately improve the productivity by shortened time of exposure, and an illuminance of 200 mW/cm$^2$ or smaller will suppress the cured film from degrading in its characteristics due to side reaction. Energy of exposure is preferably controlled in the range from 5 mJ/cm$^2$ to 1000 mJ/cm$^2$. The energy of exposure smaller than 5 mJ/cm$^2$ may narrow the exposure margin, thereby the photo-curing will be insufficient, and an undesirable problem such as adhesion of an unreacted component onto the mold will be likely to occur. Meanwhile, the energy exceeding 1000 mJ/cm$^2$ may have a risk of degradation of the cured film due to decomposition of the composition.

In the exposure of light, it is also recommendable to feed an inert gas such as nitrogen, helium or argon, to control oxygen concentration to less than 100 mg/L, in order to avoid inhibition of the radical polymerization due to oxygen.

In the method for forming a pattern of the present invention, the photo-curing of a pattern forming layer (a layer configured by the curable composition of the present invention) may optionally be followed by further curing of the cured pattern under heating. Heating of the curable composition of the present invention, after the photo-irradiation, is carried out preferably at 150 to 280° C., and more preferably at 200 to 250° C. The heating time is preferably 5 to 60 minutes, and more preferably 15 to 45 minutes.

Methods for forming a pattern are specifically exemplified by the methods described in paragraphs [0125] to [0136] of JP-A-2012-169462, the contents of which are incorporated into this specification.

The method for forming a pattern of the present invention may include coating an underlayer film-forming composition on the base to form an underlayer film; coating the curable composition of the present invention over the underlayer film; irradiating light onto the curable composition of the present invention and the underlayer film, while being held between the base and the mold having a fine pattern, to thereby cure the curable composition of the present invention; and releasing the mold. It is alternatively possible to coat the curable composition of the present invention, after coating the underlayer film-forming composition over the base, and after allowing the underlayer film-forming composition to partially cure under heating or photo-irradiation.

The underlayer film-forming composition typically contains a curable main agent. The curable main agent may be heat-curable or photo-curable, wherein it is preferably heat-curable. The curable main agent preferably has a molecular weight of 400 or larger, and may be low-molecular-weight compound or polymer, wherein it is preferably polymer. The curable main agent preferably has a molecular weight of 500 or larger, more preferably 1000 or larger, and furthermore preferably 3000 or larger. The upper limit of the molecular weight is 200000 or smaller, more preferably 100000 or smaller, and furthermore preferably 50000 or smaller. With the molecular weight controlled to 400 or larger, the components may be prevented from volatilizing in a more effective manner. The curable main agent is exemplified by the curable main agent described in paragraphs [0040] to [0056] of Japanese Translation of PCT International Application Publication No. JP-T2-2009-503139, the contents of which are incorporated into this specification.

The content of the curable main agent is preferably 30% by mass or more in the whole components excluding the solvent, more preferably 50% by mass or more, and furthermore preferably 70% by mass or more. The curable main agent may be configured by two or more species, and in this case, the total content preferably falls in the above-described range.

The underlayer film-forming composition preferably contains solvent. Preferable solvent has a boiling point under normal pressure of 80 to 200° C. The solvent may be anything so long as it can dissolve therein the underlayer film-forming composition, and is preferably solvent having at least one of ester structure, ketone structure, hydroxy group, and ether structure. More specifically, preferable solvent is selectable from propylene glycol monomethyl ether acetate, cyclohexanone, 2-heptanone, γ-butyrolactone, propylene glycol monomethyl ether, and methyl lactate, all of which may be used independently or in a mixed manner. Solvent containing propylene glycol monomethyl ether acetate is most preferable, from the viewpoint of uniformity of coating.

The content of solvent in the underlayer film-forming composition is optimized depending on viscosity of the components other than the solvent, coatability, and the target thickness. From the viewpoint of improving the coatability, the content may be 70% by mass or above of the whole composition, preferably 90% by mass or above, more preferably 95% by mass or above, and furthermore preferably 99% by mass or above.

The underlayer film-forming composition may contain, as other component, at least one species of surfactant, thermal polymerization initiator, polymerization inhibitor and catalyst. The content of these components is preferably 50% by mass or less of the whole components excluding the solvent.

The underlayer film-forming composition may be prepared by mixing the individual components described above. After addition of the individual components described above, the mixture is preferably filtered, for example, through a filter having a pore size of 0.003 μm to 5.0 μm. The filtration may be a multi-stage process, or may be repeated a number of times. The filtrate may be re-filtered. Filter material used for the filtration include polyethylene resin, polypropylene resin, fluorine-containing resin and nylon resin, but not specifically limited thereto.

The underlayer film-forming composition is coated over the base, to form the underlayer film. Method of coating is exemplified by dip coating, air knife coating, curtain coating, wire bar coating, gravure coating, extrusion coating, spin coating, slit scan coating and ink jet process, by which a coated film or liquid droplets may be arranged on the base. From the viewpoint of uniformity of film thickness, spin coating is more preferable. The solvent is then dried. The drying temperature is preferably 70° C. to 130° C. More preferably the film is further cured by active energy (preferably heat and/or light). Curing under heating at 150° C. to 250° C. is preferable. The solvent vaporizing process and the curing process may take place at the same time. As described above, it is preferable that the coating of the underlayer film-forming composition is followed by curing of a part of the underlayer film-forming composition under heating of photo-irradiation, and then by coating of the curable composition of the present invention. According to such procedure, also the underlayer film-forming composition completely cures during the photo-irradiation of the curable composition of the present invention, raising tendency of improving the adherence.

The thickness of the under layer film composed of the curable composition of the present invention is approximately 0.1 nm to 100 nm, preferably 0.5 to 20 nm, and more preferably 1 to 10 nm, which may vary depending on applications. The underlayer film-forming composition may be coated by multiple coating. The obtained underlayer film is preferably as flat as possible.

The base (substrate or support) is selectable depending on various applications, without special limitation, from the bases composed of quartz, glass, optical film, ceramic material, evaporated film, magnetic film, reflective film, metal bases composed of Ni, Cu, Cr or Fe, paper, SOG (Spin On Glass), polymer bases such as polyester film, polycarbonate film and polyimide film, base having TFT array formed thereon, electrode panel of PDP, glass or translucent plastic bases, electro-conductive base made of ITO or metal, and semiconductor producing base such as insulating base, silicon, silicon nitride, polysilicon, silicon oxide and amorphous silicon. However, when used for etching, the base is preferably a base for manufacturing semiconductor devices.
Fine Pattern The fine pattern, formed by the method for forming a pattern of the present invention as described above, may be used as a permanent film (resist for forming structural members) typically used for liquid crystal display (LCD), or as an etching resist.

The pattern formed by using the curable composition of the present invention also has a good solvent resistance. It is preferable that the curable composition in the present invention is highly durable against a variety of solvents, and it is particularly preferable that the film will not vary the thickness even after immersed in any solvent generally used for base manufacturing process, for example, in N-methylpyrrolidone at 25° C. for 10 minutes.

The pattern formed by the method for forming a pattern of the present invention is also useful as an etching resist. When the curable composition of the present invention is used as the etching resist, first, for example a silicon wafer having formed thereon a film of $SiO_2$ or the like is used as the base, and on the base a fine pattern of nanometer size is formed by the method of forming a pattern of the present invention. Thereafter, a desired pattern may be formed on the base by etching, typically using hydrofluoric acid for wet etching, or typically using an etching gas such as $CF_4$ for dry etching. It is preferable that the curable composition of the present invention also has a good etching resistance against dry etching using fluorocarbon or the like.
Method for Manufacturing Semiconductor Device The method for manufacturing a semiconductor device of the present invention is characterized in that the fine pattern described above is used as an etching mask. Using the fine pattern described above as the etching mask, a base is processed. For example, dry etching is carried out using the fine pattern as the etching mask, to thereby selectively remove the surficial portion of the base. By repetitively processing the base in this way, a semiconductor device may be obtained. The semiconductor device is typically an LSI (large scale integrated circuit).

Example

The present invention will further be detailed referring to Examples. Materials, amounts of consumption, ratios, details of processes, and procedures of processes described in Examples below may be modified appropriately, without departing from the spirit of the present invention. It should therefore be understood that the present invention is by no means limited to the specific examples explained below.
<Preparation of Curable Composition for Photo Imprints>

The polymerizable compound (A), the photo-polymerization initiator (B) and the mold releasing agent (C) were mixed according to the ratios summarized in Table 1 below, and 200 ppm (0.02% by mass), relative to the curable composition, of 4-hydroxy-2,2,6,6-tetramethylpiperidine-1-oxyl, free radical (from Tokyo Chemical Industry Co., Ltd.) was added as a polymerization inhibitor. The mixture was filtered through a 0.1 μm-PTFE filter, to thereby prepare curable compositions for photo imprints of the present invention X1 to X10, and comparative curable compositions R1 to R5. Values in Table 1 are given in ratio by weight. Viscosity at 23° C. and surface tension of the thus prepared curable compositions were measured. Results were summarized in Table below.

Details of the polymerizable compound (A), the photo-polymerization initiator (B) and the mold releasing agent (C), used in Examples and Comparative Examples are as shown below.
<Polymerizable Compound (A)>
A-1: 2-Phenoxyethyl acrylate (Viscoat #192, from Osaka Organic Chemical Industry Ltd.)
A-2: Synthesized from 2-bromomethylnaphthalene and acrylic acid
A-3: Neopentyl glycol diacrylate (Light Acrylate NP-A, from Kyoeisha Chemical Co., Ltd.)
A-4: Synthesized from α,α'-dichloro-m-xylene and acrylic acid

[Chemical Formula 14]

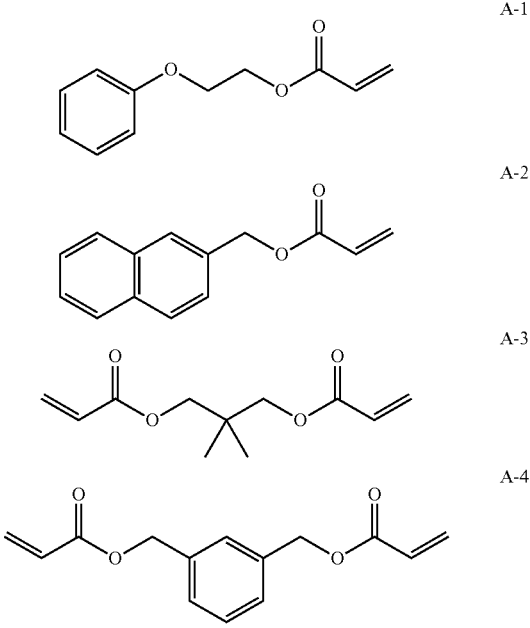

<Photo-Polymerization Initiator (B)>
B-1: Irgacure 819 (from BASF)
B-2: Lucirin TPO (from BASF)
B-3: Darocure 1173 (from BASF)
B-4: Irgacure OXE01 (from BASF)
<Mold Releasing Agent (C)>
C-2 to C-4, C-6, C-12 and C-15 were synthesized as the mold releasing agent (C). Also S-4 was synthesized as comparative compound (S) for comparison with the mold releasing agent (C).

(Synthesis of Mold Releasing Agent (C-2))

[Chemical Formula 15]

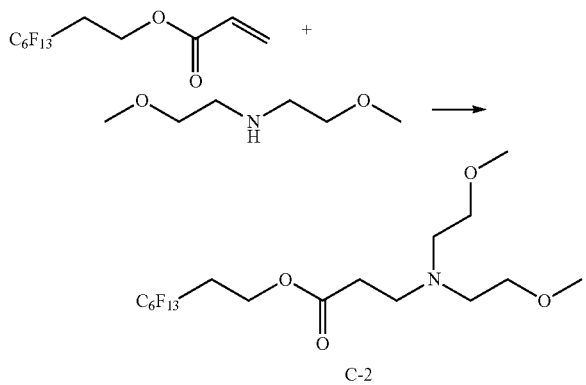

Mixed were 20.9 g of 3,3,4,4,5,5,6,6,7,7,8,8,8-tridecafluorooctyl acrylate and 8.1 g of di(2-methoxyethyl)amine, and the mixture was allowed to react at 50° C. for 24 hours. To the obtained reaction mixture, 150 mL of ethyl acetate and 150 mL of water were added for separating extraction. The organic layer was condensed under reduced pressure to obtain a target mold releasing agent (C-2). The yield of the mold releasing agent (C-2) was 27.0 g, and the yield ratio of the mold releasing agent (C-2) was 98%.

(Synthesis of Mold Releasing Agent (C-3))

[Chemical Formula 16]

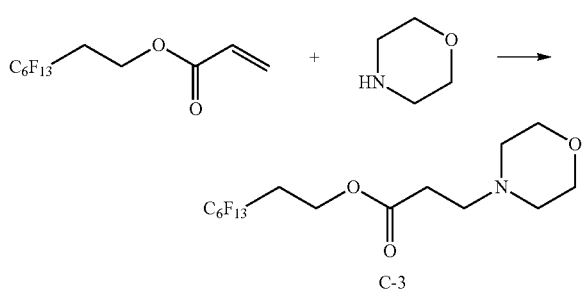

To a mixed solution of 20.9 g of 3,3,4,4,5,5,6,6,7,7,8,8,8-tridecafluorooctyl acrylate and 20 g of ethyl acetate, added dropwise was 4.8 g of morpholine over 10 minutes. The mixture was then allowed to react at 40° C. for two hours. To the obtained reaction mixture, 150 mL of ethyl acetate and 150 mL of water were added for separating extraction. The organic layer was condensed under reduced pressure to obtain a target mold releasing agent (C-3). The yield of the mold releasing agent (C-3) was 24.8 g, and the yield ratio of the mold releasing agent (C-3) was 98%.

(Synthesis of Mold Releasing Agent (C-4))

[Chemical Formula 17]

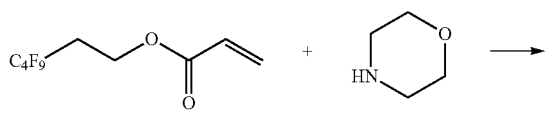

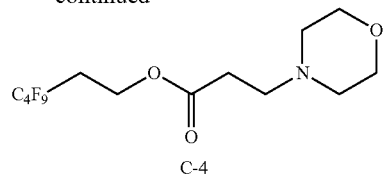

To a mixed solution of 15.9 g of 3,3,4,4,5,5,6,6,6-nonafluorohexyl acrylate and 20 g of ethyl acetate, added dropwise was 4.8 g of morpholine over 10 minutes. The mixture was then allowed to react at 40° C. for two hours. To the obtained reaction mixture, 150 mL of ethyl acetate and 150 mL of water were added for separating extraction. The organic layer was condensed under reduced pressure to obtain a target mold releasing agent (C-4). The yield of the mold releasing agent (C-4) was 20.1 g, and the yield ratio of the mold releasing agent (C-4) was 99%.

(Synthesis of Mold Releasing Agent (C-6))

[Chemical Formula 18]

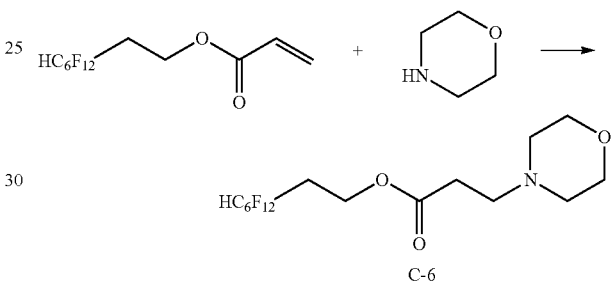

To a mixed solution of 19.3 g of 3,3,4,4,5,5,6,6,7,7,8,8-dodecafluorooctyl acrylate and 20 g of ethyl acetate, added dropwise was 4.8 g of morpholine over 10 minutes. The mixture was then allowed to react at 40° C. for two hours. To the obtained reaction mixture, 150 mL of ethyl acetate and 150 mL of water were added for separating extraction. The organic layer was condensed under reduced pressure to obtain a target mold releasing agent (C-6). The yield of the mold releasing agent (C-6) was 22.2 g, and the yield ratio of the mold releasing agent (C-4) was 94%.

(Synthesis of Mold Releasing Agent (C-12))

[Chemical Formula 19]

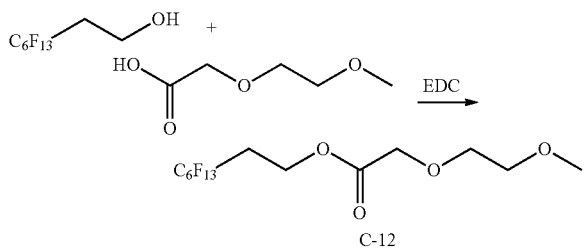

To a mixed solution of 36.4 g of 3,3,4,4,5,5,6,6,7,7,8,8,8-tridecafluoro-1-octanol, 14.8 g of 2-(2-methoxyethoxyl)acetic acid and 300 mL of ethyl acetate, added was 17.1 g of N-ethyl-N'-(3-dimethylaminopropyl)carbodiimide (EDC) as a condensing agent, and the mixture was allowed to react at room temperature for six hours. The obtained reaction mixture was washed with 300 ml of an aqueous dilute hydrochloric acid solution, next with 300 mL of sodium bicarbonate water, and lastly with 300 mL of water, for separating extraction. The organic layer was then condensed under reduced pressure to obtain a target mold releasing agent (C-12). The yield of the mold releasing agent (C-12) was 46.1 g, and the yield ratio of the mold releasing agent (C-12) was 96%.
(Synthesis of Mold Releasing Agent (C-15))

[Chemical Formula 20]

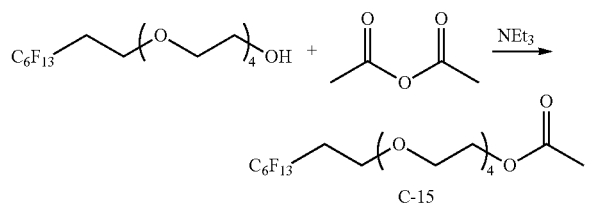

To a mixed solution of 27.0 g of Megafac F-444 (from DIC Corporation), 10.2 g of acetic anhydride, and 300 mL of ethyl acetate, added dropwise was 10.1 g of triethylamine (NEt$_3$), and the mixture was allowed to react at room temperature for 24 hours. The obtained reaction mixture was washed with 300 mL of an aqueous dilute hydrochloric acid solution, next with 300 mL of sodium bicarbonate water, and lastly with 300 mL of water, for separating extraction. The organic layer was then condensed under reduced pressure to obtain a target mold releasing agent (C-15). The yield of the mold releasing agent (C-15) was 30.5 g, and the yield ratio of the mold releasing agent (C-12) was 88%.
(Synthesis of Mold Releasing Agent (C-20))

[Chemical Formula 21]

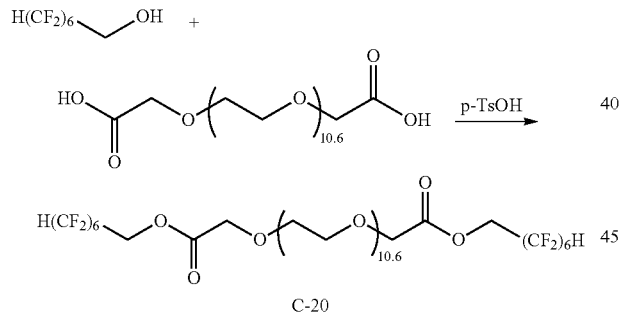

Mixed were 33.2 g of 1H, 1H,7H-perfluoroheptanol, 30.0 g of poly(ethylene glycol) bis(carboxymethyl) ether (from Aldrich, Mn=600), 1.0 g of p-toluenesulfonic acid monohydrate, and 30 mL of toluene, and the mixture was allowed to react under heating and refluxing for six hours, while removing water using a Dean-Stark apparatus. To the obtained reaction mixture, 300 mL of chloroform was added, which was followed by addition of 300 mL of sodium bicarbonate water for separating extraction, and addition of 300 mL of water for washing. The organic layer was then condensed under reduced pressure, to obtain a target mold releasing agent (C-20). The yield of the mold releasing agent (C-20) was 55.3 g, and the yield ratio was 90%.
(Synthesis of Mold Releasing Agent (C-22))

[Chemical Formula 22]

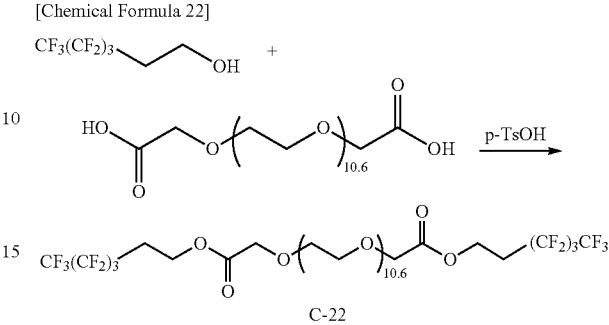

Mixed were 26.4 g of 1H, 1H,2H,2H-perfluorohexanol, 30.0 g of poly(ethylene glycol) bis(carboxymethyl) ether (from Aldrich, Mn=600) 1.0 g of p-toluenesulfonic acid monohydrate, and 30 mL of toluene, and the mixture was allowed to react under heating and refluxing for six hours, while removing water using a Dean-Stark apparatus. To the obtained reaction mixture, 300 mL of chloroform was added, which was followed by addition of 300 mL of sodium bicarbonate water for separating extraction, and addition of 300 mL of water for washing. The organic layer was then condensed under reduced pressure, to obtain a target mold releasing agent (C-22). The yield of the mold releasing agent (C-22) was 50.3 g, and the yield ratio was 92%.
<Comparative Compound (S)>
S-1: ZONYL FSO-100 (from DUPONT): S-1 has a general structure of $R^1R^2$, where $R^1$=F(CF$_2$CF$_2$)$_y$, y is 1 to 7, $R^2$=CH$_2$CH$_2$O(CH$_2$CH$_2$O)$_x$H, and x is 0 to 15.
S-2: FLUORAD FC4430 (from 3M Company)
S-3: R-1620 (from Daikin Industries, Ltd.)
S-4: Synthesized referring to the description of paragraphs [0085] to of JP-A-2010-239121.

[Chemical Formula 23]

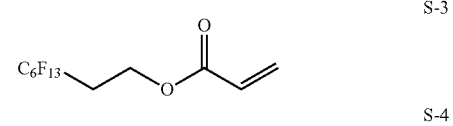

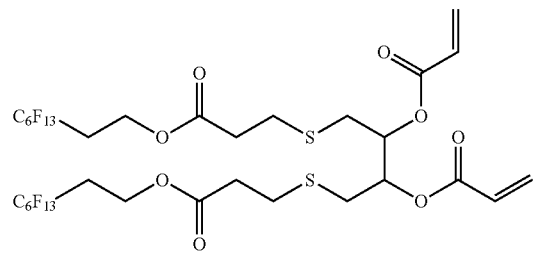

TABLE 1

| | X-1 | X-2 | X-3 | X-4 | X-5 | X-6 | X-7 | X-8 | X-9 | X-10 | X-11 | X-12 | X-13 | X-14 | R-1 | R-2 | R-3 | R-4 | R-5 |
|---|---|---|---|---|---|---|---|---|---|---|---|---|---|---|---|---|---|---|---|
| A-1 | | | | | | | | 48 | | | | | | | | | | | |
| A-2 | | | | | | | | | | | | | | 48 | | | | | |

TABLE 1-continued

| | X-1 | X-2 | X-3 | X-4 | X-5 | X-6 | X-7 | X-8 | X-9 | X-10 | X-11 | X-12 | X-13 | X-14 | R-1 | R-2 | R-3 | R-4 | R-5 |
|---|---|---|---|---|---|---|---|---|---|---|---|---|---|---|---|---|---|---|---|
| A-3 | 23 | 23 | 23 | 23 | 23 | 23 | | | 22 | 23 | 22 | 23 | 22 | 22 | 23 | 23 | 23 | 23 | 24 |
| A-4 | 73 | 73 | 73 | 73 | 73 | 73 | 48 | 48 | 72 | 73 | 72 | 73 | 71 | 68 | 73 | 73 | 73 | 73 | 74 |
| B-1 | 2 | 2 | 2 | 2 | 2 | 2 | 2 | 2 | | | 2 | 2 | 2 | 2 | 2 | 2 | 2 | 2 | 2 |
| B-2 | | | | | | | | | 2 | | | | | | | | | | |
| B-3 | | | | | | | | | 2 | | | | | | | | | | |
| B-4 | | | | | | | | | | 2 | | | | | | | | | |
| C-2 | 2 | | | | | | | | | | | | | | | | | | |
| C-3 | | 2 | | | | | 2 | 2 | 2 | 2 | | | | | | | | | |
| C-4 | | | 2 | | | | | | | | | | | | | | | | |
| C-6 | | | | 2 | | | | | | | | | | | | | | | |
| C-12 | | | | | 2 | | | | | | | | | | | | | | |
| C-15 | | | | | | 2 | | | | | | | | | | | | | |
| C-20 | | | | | | | | | | | 2 | | | | | | | | |
| C-22 | | | | | | | | | | | | 2 | 5 | 8 | | | | | |
| S-1 | | | | | | | | | | | | | | | 2 | | | | |
| S-2 | | | | | | | | | | | | | | | | 2 | | | |
| S-3 | | | | | | | | | | | | | 2 | | | | 2 | | |
| S-4 | | | | | | | | | | | | | | | | | | 2 | |
| viscosity (mPa · s) | 10 | 10 | 10 | 10 | 10 | 10 | 11 | 12 | 10 | 10 | 10 | 10 | 10 | 11 | 10 | 10 | 10 | 10 | 10 |
| surface tension (mN/m) | 27 | 30 | 34 | 33 | 28 | 32 | 30 | 30 | 29 | 31 | 30 | 33 | 31 | 30 | 20 | 23 | 31 | 18 | 39 |

<Preparation of Underlayer Film-Forming Composition>

Three grams of NK Oligo EA-7140/PGMAc (from Shin-Nakamura Chemical Co., Ltd.) was dissolved into 997 g of propylene glycol monomethyl ether acetate, and the mixture was filtered through a 0.1 μm-tetrafluoroethylene filter to obtain an underlayer film-forming composition.

[Chemical Formula 24]

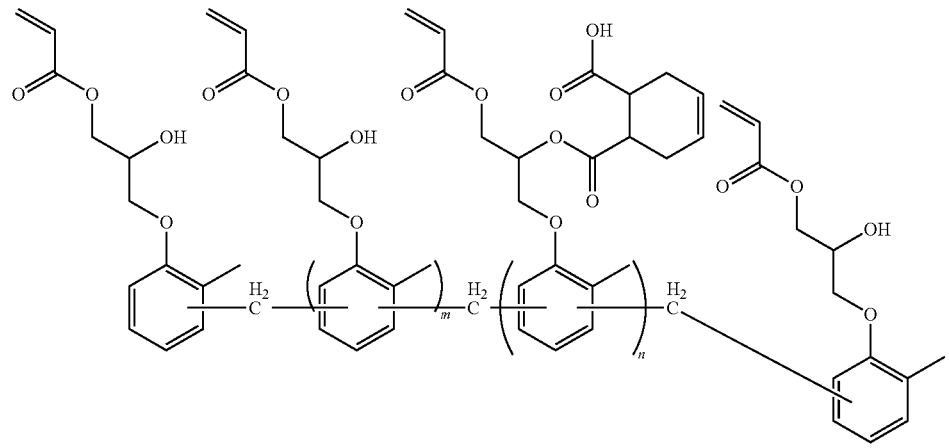

NK Oligo EA-7140/PGMAc (solid content = 70%)
average m + n = 4, average n/(m + n) = 0.5

(Evaluation)

The curable compositions for imprints obtained in the individual Examples and Comparative Examples were evaluated as described below. Results were summarized in Table 2 below.

<Positional Accuracy of Ink Jetting>

The curable composition for photo imprints, conditioned at 23° C., was discharged onto a silicon wafer using an ink jet printer DMP-2831 (FUJIFILM Dimatix, Inc.) at a volume of liquid droplet of 1 pl per nozzle, so as to form a square matrix of liquid droplets with a 100-μm pitch on the silicon wafer.

On the coated base, 2500 dots in a 5-mm square area were observed to measure shifts from the square matrix, and to calculate standard deviation σ. The positional accuracy of ink jetting was evaluated by ranks of A to D below:

A: σ<3 μm
B: 3 μm≤σ≤5 μm
C: 5 μm≤σ≤10 μm
D: 10 μm≤σ

<Evaluation of Mold Releasability>

The underlayer film-forming composition was coated over a silicon wafer by spin coating, and the coated film was heated at 100° C. on a hot plate for one minute to dry out the solvent. The coated film was further heated to 220° C. on the hot plate for 5 minutes to cure the underlayer film-forming composition, to thereby form the underlayer film. The cured underlayer film was found to be 3 nm thick.

The curable composition for photo imprints, conditioned at 23° C., was discharged onto the surface of the underlayer film on the silicon wafer, using the ink jet printer DMP-2831 (FUJIFILM Dimatix, Inc.) at a volume of liquid droplet of 1 pl per nozzle, so as to form a square matrix of liquid droplets with a 100-μm pitch on the underlayer film.

The photo-curable composition coated on the underlayer film was brought into contact, under a reduced pressure of 0.1 atm, with a quartz mold (line/space=1/1, line width=30 nm, groove depth=60 nm, line edge roughness=3.0 nm), and then irradiated with light from the quartz mold side using a high-pressure mercury lamp under a condition of 100 mJ/cm². After the light exposure, the quartz mold was released, and the mold releasing force (F) in this process was measured. The mold releasing force (F) was measured in accordance with the method described in paragraphs [0102] to [0107] of JP-A-2011-206977. The mold releasing force was evaluated by ranks A to E below:

S: F<12 N
A: 12 N≤F<13 N
B: 13 N≤F<15 N
C: 15 N≤F<20 N
D: 20% F≤30 N
E: 30% N≤F

TABLE 2

| | Curable Composition for Optical Imprinting | Positional Accuracy of Ink Jetting | Mold releasing force |
|---|---|---|---|
| Example 1 | X-1 | B | A |
| Example 2 | X-2 | A | A |
| Example 3 | X-3 | B | A |
| Example 4 | X-4 | B | A |
| Example 5 | X-5 | B | B |
| Example 6 | X-6 | B | B |
| Example 7 | X-7 | A | A |
| Example 8 | X-8 | A | A |
| Example 9 | X-9 | A | A |
| Example 10 | X-10 | A | A |
| Example 11 | X-11 | A | S |
| Example 12 | X-12 | B | S |
| Example 13 | X-13 | A | S |
| Example 14 | X-14 | A | S |
| Comparative example 1 | R-1 | D | B |
| Comparative example 2 | R-2 | D | C |
| Comparative example 3 | R-3 | B | D |
| Comparative example 4 | R-4 | C | C |
| Comparative example 5 | R-5 | D | E |

As is clearly understood from the results in Table, the curable compositions for photo imprints obtained in Examples 1 to 14 showed good results of evaluation in terms of the positional accuracy of ink jetting and mold releasing force.

Meanwhile, the curable compositions for photo imprints obtained in Comparative Examples 1 to 5 showed poor results of evaluation in terms of the positional accuracy of ink jetting and mold releasing force, due to absence of the mold releasing agent (C) represented by the formula (I) above.

As described above, it was confirmed that the present invention can provide a curable composition for photo imprints excellent in ink jettability and mold releasability, by incorporating the polymerizable compound (A), the photo-polymerization initiator (B), and the mold releasing agent (C) represented by the formula (I) above, into the curable composition for photo imprints.

What is claimed is:

1. A curable composition for photo imprints, comprising:
a polymerizable compound (A);
a photo-polymerization initiator (B);
a mold releasing agent (C); and
3% by mass or less of a solvent,
the mold releasing agent (C) being represented by the formula (I) below:

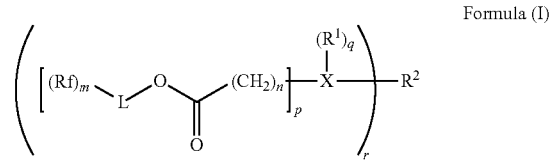

Formula (I)

wherein Rf represents a $C_{1-8}$ fluorine-containing alkyl group having two or more fluorine atoms; m represents 1; L represents a single bond or divalent linking group; n represents 1 or 2; X represents a single bond, oxygen atom, sulfur atom, or nitrogen atom; $R^1$ represents a $C_{1-8}$ substituent being free from a polymerizable group; $R^2$ represents a hydrogen atom, $C_{1-8}$ substituent, or divalent linking group; p represents 1 or 2, q represents 0 or 1, and r represents 1 or 2; $R^1$ and $R^2$ may combine with each other to form a ring;
wherein $R^2$ is free from a polymerizable group.

2. The curable composition for photo imprints of claim 1, wherein the mold releasing agent (C) represented by the formula (I) has one or more ether groups.

3. The curable composition for photo imprints of claim 1, wherein the mold releasing agent (C) represented by the formula (I) has two or more ether groups, an ether group and an amino group, or an ether group and a sulfide group.

4. The curable composition for photo imprints of claim 1, wherein the mold releasing agent (C) is represented by any one of the formulae (II) to (V) below:

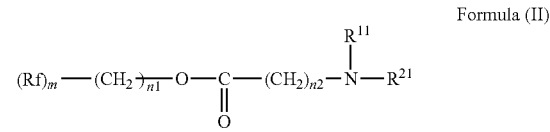

Formula (II)

wherein Rf represents a $C_{1-8}$ fluorine-containing alkyl group having two or more fluorine atoms; m represents 1; n1 represents an integer of 0 to 4; n2 represents 1 or 2; each of $R^{11}$ and $R^{21}$ represents a $C_{1-8}$ substituent being free from a polymerizable group; $R^{11}$ and $R^{21}$ may be same or different, or may combine with each other to form a ring;

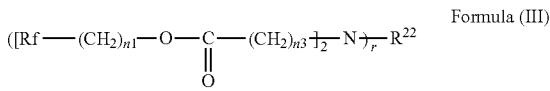

Formula (III)

wherein Rf represents a $C_{1-8}$ fluorine-containing alkyl group having two or more fluorine atoms; n1 represents an integer of 0 to 4; n3 represents 1 or 2; r represents 1 or 2; $R^{22}$ represents a $C_{1-8}$ substituent being free from a polymerizable group, or divalent linking group;

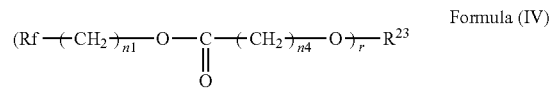

Formula (IV)

wherein Rf represents a $C_{1-8}$ fluorine-containing alkyl group having two or more fluorine atoms; n1 represents an integer of 0 to 4; n4 represents 1 or 2; r represents 1 or 2; $R^{23}$ represents a $C_{1-8}$ substituent being free from a polymerizable group, or divalent linking group;

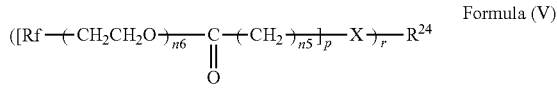
Formula (V)

wherein Rf represents a $C_{1-8}$ fluorine-containing alkyl group having two or more fluorine atoms; n5 represents 1 or 2; n6 represents an integer of 1 to 10; p represents 1 or 2; r represents 1 or 2; X represents a single bond, oxygen atom, sulfur atom, or nitrogen atom; $R^{24}$ represents a hydrogen atom, divalent linking group, or $C_{1-8}$ substituent being free from polymerizable group.

5. The curable composition for photo imprints of claim 2, wherein the mold releasing agent (C) is represented by any one of the formulae (II) to (V) below:

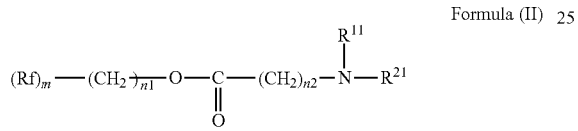
Formula (II)

wherein Rf represents a $C_{1-8}$ fluorine-containing alkyl group having two or more fluorine atoms; m represents 1; n1 represents an integer of 0 to 4; n2 represents 1 or 2; each of $R^{11}$ and $R^{21}$ represents a $C_{1-8}$ substituent being free from a polymerizable group; $R^{11}$ and $R^{21}$ may be same or different, or may combine with each other to form a ring;

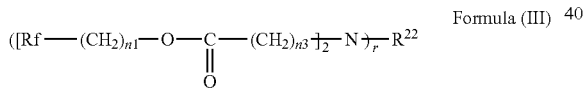
Formula (III)

wherein Rf represents a $C_{1-8}$ fluorine-containing alkyl group having two or more fluorine atoms; n1 represents an integer of 0 to 4; n3 represents 1 or 2; r represents 1 or 2; $R^{22}$ represents a $C_{1-8}$ substituent being free from a polymerizable group, or divalent linking group;

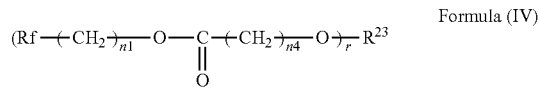
Formula (IV)

wherein Rf represents a $C_{1-8}$ fluorine-containing alkyl group having two or more fluorine atoms; n1 represents an integer of 0 to 4; n4 represents 1 or 2; r represents 1 or 2; $R^{23}$ represents a $C_{1-8}$ substituent being free from a polymerizable group, or divalent linking group;

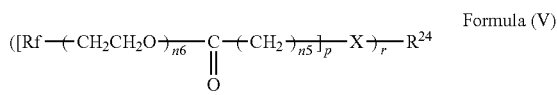
Formula (V)

wherein Rf represents a $C_{1-8}$ fluorine-containing alkyl group having two or more fluorine atoms; n5 represents 1 or 2; n6 represents an integer of 1 to 10; p represents 1 or 2; r represents 1 or 2; X represents a single bond, oxygen atom, sulfur atom, or nitrogen atom; $R^{24}$ represents a hydrogen atom, divalent linking group, or $C_{1-8}$ substituent being free from polymerizable group.

6. The curable composition for photo imprints of claim 3, wherein the mold releasing agent (C) is represented by any one of the formulae (II) to (V) below:

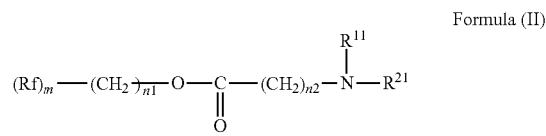
Formula (II)

wherein Rf represents a $C_{1-8}$ fluorine-containing alkyl group having two or more fluorine atoms; m represents 1; n1 represents an integer of 0 to 4; n2 represents 1 or 2; each of $R^{11}$ and $R^{21}$ represents a $C_{1-8}$ substituent being free from a polymerizable group; $R^{11}$ and $R^{21}$ may be same or different, or may combine with each other to form a ring;

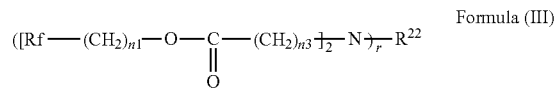
Formula (III)

wherein Rf represents a $C_{1-8}$ fluorine-containing alkyl group having two or more fluorine atoms; n1 represents an integer of 0 to 4; n3 represents 1 or 2; r represents 1 or 2; $R^{22}$ represents a $C_{1-8}$ substituent being free from a polymerizable group, or divalent linking group;

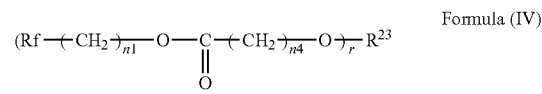
Formula (IV)

wherein Rf represents a $C_{1-8}$ fluorine-containing alkyl group having two or more fluorine atoms; n1 represents an integer of 0 to 4; n4 represents 1 or 2; r represents 1 or 2; $R^{23}$ represents a $C_{1-8}$ substituent being free from a polymerizable group, or divalent linking group;

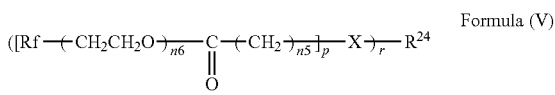
Formula (V)

wherein Rf represents a $C_{1-8}$ fluorine-containing alkyl group having two or more fluorine atoms; n5 represents 1 or 2; n6 represents an integer of 1 to 10; p represents 1 or 2; r represents 1 or 2; X represents a single bond, oxygen atom, sulfur atom, or nitrogen atom; $R^{24}$ represents a hydrogen atom, divalent linking group, or $C_{1-8}$ substituent being free from polymerizable group.

7. The curable composition for photo imprints of claim 1, wherein in the formula (I), Rf has ($CF_3$—) or ($HCF_2$—) at a terminal thereof.

8. The curable composition for photo imprints of claim 2, wherein in the formula (I), Rf has ($CF_3$—) or ($HCF_2$—) at a terminal thereof.

9. The curable composition for photo imprints of claim 3, wherein in the formula (I), Rf has ($CF_3$—) or ($HCF_2$—) at a terminal thereof.

10. The curable composition for photo imprints of claim 1, wherein in the formula (I), L is a single bond, $C_{1-12}$ alkylene group, or polyoxyethylene group.

11. The curable composition for photo imprints of claim 2, wherein in the formula (I), L is a single bond, $C_{1-12}$ alkylene group, or polyoxyethylene group.

12. The curable composition for photo imprints of claim 3, wherein in the formula (I), L is a single bond, $C_{1-12}$ alkylene group, or polyoxyethylene group.

13. The curable composition for photo imprints of claim 1, wherein the polymerizable compound (A) is a (meth)acrylate compound.

14. The curable composition for photo imprints of claim 1, wherein the polymerizable compound (A) is a compound having an aromatic group.

15. The curable composition for photo imprints of claim 1, which has a viscosity at 23° C. of 15 mPa·s or smaller and a surface tension of 25 to 35 mN/m.

16. The curable composition for photo imprints of claim 1, wherein the content of the photo-polymerization initiator is 0.5 to 15% by mass, relative to the entirety of the components excluding solvent.

17. The curable composition for photo imprints of claim 1, wherein the curable composition has a viscosity at 23° C. of 15 mPa·s or less.

18. The curable composition for photo imprints of claim 1, wherein the polymerizable compound (A) has a weight average molecular weight of 1,000 or less.

19. The curable composition for photo imprints of claim 1, wherein the content of the mold releasing agent (C) in the curable composition is 0.1 to 10% by mass.

20. The curable composition for photo imprints of claim 1, wherein the mold releasing agent (C) has a molecular weight of 1,000 or less.

21. The curable composition for photo imprints of claim 1, wherein X represents a single bond, p=1, q=0, r=2 and $R^2$ represents —O—.

22. A method for forming a pattern, the method comprising:
coating a curable composition for photo imprints described in claim 1 on a base, or on a mold having a fine pattern; and irradiating light onto the curable composition for photo imprints while being held between the mold and the base.

23. The method for forming a pattern of claim 22, wherein the curable composition for photo imprints is coated on the base or on the mold having a fine pattern by an ink jet process.

24. A fine pattern obtainable by a method described in claim 22.

25. A method for manufacturing a semiconductor device, comprising using the fine pattern described in claim 24 as an etching mask.

* * * * *